US010879506B2

United States Patent
Kim et al.

(10) Patent No.: US 10,879,506 B2
(45) Date of Patent: Dec. 29, 2020

(54) BATTERY MOUNTING STRUCTURE AND ELECTRONIC DEVICE HAVING THE SAME

(71) Applicant: Samsung Electronics Co., Ltd., Suwon-si (KR)

(72) Inventors: Ki-Won Kim, Yongin-si (KR); Hun-Young Ryu, Hwaseong-si (KR); Young-Joon Choi, Uiwang-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 133 days.

(21) Appl. No.: 16/037,258

(22) Filed: Jul. 17, 2018

(65) Prior Publication Data

US 2019/0074491 A1   Mar. 7, 2019

(30) Foreign Application Priority Data

Sep. 4, 2017   (KR) .......................... 10-2017-0112639

(51) Int. Cl.
*H01M 2/10* (2006.01)
*G06F 1/18* (2006.01)
(Continued)

(52) U.S. Cl.
CPC ........ *H01M 2/1022* (2013.01); *G06F 1/1635* (2013.01); *G06F 1/188* (2013.01);
(Continued)

(58) Field of Classification Search
CPC .......................... H01M 2/1022; H01M 2/1066; H05K 5/0086; H05K 7/1427; G06F 1/1635; G06F 1/188
(Continued)

(56) References Cited

U.S. PATENT DOCUMENTS

| 2010/0248004 A1 | 9/2010 | Takeshita et al. |
| 2011/0110063 A1 | 5/2011 | Sauers |

(Continued)

FOREIGN PATENT DOCUMENTS

| KR | 10-2006-0005064 A | 1/2006 |
| KR | 10-2012-0055018 A | 5/2012 |
| KR | 10-2017-0032098 A | 3/2017 |

OTHER PUBLICATIONS

International Search Report and Written Opinion dated Oct. 23, 2018; International Appln. No. PCT/KR2018/008129.

*Primary Examiner* — James M Erwin
(74) *Attorney, Agent, or Firm* — Jefferson IP Law, LLP

(57) ABSTRACT

A battery mounting structure and an electronic device having the same is provided. The electronic device includes a housing including a first plate that faces a first direction, a second plate that faces a second direction opposite to the first direction, and a side member that surrounds a space between the first and second plates, a printed circuit board (PCB) disposed in the space of the housing, a battery that at least partially faces the PCB, a bracket that surrounds at least one face of the battery, and an elastic structure disposed between the battery and the bracket and located on an edge region of the battery. The elastic structure may include an elastic member, a first adhesive member disposed on a first face of the elastic member that faces the first direction, and a second adhesive member disposed on a second face that faces the second direction.

6 Claims, 24 Drawing Sheets

(51) Int. Cl.
*H04L 29/08* (2006.01)
*H01M 10/42* (2006.01)
*G06F 1/16* (2006.01)
*H05K 5/00* (2006.01)
*H05K 7/14* (2006.01)
*H04L 12/28* (2006.01)

(52) U.S. Cl.
CPC .......... *H01M 10/425* (2013.01); *H04L 67/12* (2013.01); *H04L 67/18* (2013.01); *H05K 5/0086* (2013.01); *H05K 7/1427* (2013.01); *H01M 2/1066* (2013.01); *H01M 2220/30* (2013.01); *H04L 12/2854* (2013.01)

(58) Field of Classification Search
USPC ........................................................ 429/100
See application file for complete search history.

(56) References Cited

U.S. PATENT DOCUMENTS

2011/0159328 A1    6/2011  Yeo
2014/0106200 A1*  4/2014  Saiki ....................... H01M 2/22
                                                                           429/121

* cited by examiner

| DATA ATTRIBUTE | COMMUNICATION METHOD | | IMMEDIACY |
| --- | --- | --- | --- |
| | FIRST COMMUNICATION MODULE | SECOND COMMUNICATION MODULE | |
| SECURITY UPDATE | O | O | O |
| SMALL CAPACITY UPDATE | O | O | X |
| LARGE CAPACITY UPDATE | X | O | X |
| WI-FI AP LIST INFORMATION | X | O | X |

FIG.21

BATTERY MOUNTING STRUCTURE AND ELECTRONIC DEVICE HAVING THE SAME

CROSS-REFERENCE TO RELATED APPLICATION(S)

This application is based on and claims priority under 35 U.S.C. § 119(a) of a Korean patent application number 10-2017-0112639, filed on Sep. 4, 2017, in the Korean Intellectual Property Office, the disclosure of which is incorporated by reference herein in its entirety.

BACKGROUND

1. Field

The disclosure relates to a battery mounting structure included in an electronic device, and an electronic device including the battery mounting structure.

2. Description of Related Art

The term electronic device may mean a device that performs specific functions according to programs incorporated therein, including an electronic scheduler, a portable multimedia reproducer, a mobile communication terminal, a tablet personal computer (PC), an image/sound device, a desktop PC, a laptop PC, or a vehicular navigation system, as well as home appliances. For example, the above-mentioned electronic devices may output information stored therein as sound or an image. As the integration degree of such electronic devices has increased and super-high speed and large capacity wireless communication has become popular, various functions have recently been provided in a single electronic device, such as a mobile communication terminal. For example, various functions, such as an entertainment function (e.g., a game function), a multimedia function (e.g., a music/video reproducing function), a communication and security function for mobile banking, a schedule management function, and an e-wallet function, are integrated in a single electronic device, in addition to a communication function.

An electronic device may be mounted with a battery. In the case of an embedded battery incorporated in a portable electronic device, a built-in battery includes a printed circuit board (PCB) or a flexible printed circuit board (FPCB) and a connector, and an electrical connection is established by fastening the PCB and a board within a portable terminal to each other.

The above information is presented as background information only to assist with an understanding of the disclosure. No determination has been made, and no assertion is made, as to whether any of the above might be applicable as prior art with regard to the disclosure.

SUMMARY

In the case of an electronic device in which a battery is mounted, an external impact to the electronic device may be transmitted to the battery, causing stress to the battery. For example, when the battery is disposed to be in contact with the inner face of the electronic device, an external impact may be directly transmitted to the battery, causing stress. As another example, deterioration of a battery due to the operation of an electronic device may cause shape deformation of the battery, and an external shock may be transferred to a shape-changed portion of the battery, causing stress. As another example, in order to minimize the interference between a battery and a mounting portion in an electronic device, a configuration of the mounting portion in plan view is designed assuming that the dimension of the battery is the maximum size. Since the size of the mounting portion in plan view is relatively larger than that of the battery to be assembled on an actual product, a gap between the battery and the mounting portion may be generated. The gap may cause the battery to move when an external impact is applied to the electronic device, which may cause repeated vibrations and stress in the battery through the impact with the mounting portion. Continued stress may cause, for example, damage (such as short circuit of the battery, flexible printed circuit board (FPCB), and/or an electrode), heat generation, or ignition in the internal material of the battery.

Aspects of the disclosure are to address at least the above-mentioned problems and/or disadvantages and to provide at least the advantages described below. Accordingly, it is possible to secure a separation distance between the battery disposed on the mounting portion in the electronic device and devices adjacent to the battery, thereby suppressing an impact from being caused by the deformation of the battery.

Another aspect of the disclosure is to provide a structure made of an elastic material structure may be disposed in a peripheral region of the battery mounted on the mounting portion in the electronic device, thereby suppressing an impact from being transmitted to the battery, and the impact may be dispersed by reducing the movement by the elasticity of the structure.

Additional aspects will be set forth in part in the description which follows and, in part, will be apparent from the description, or may be learned by practice of the presented embodiments.

In accordance with an aspect of the disclosure, an electronic device is provided. The electronic device includes a housing including a first plate that faces a first direction, a second plate that faces a second direction opposite to the first direction, and a side member that surrounds a space between the first and second plates, a printed circuit board (PCB) disposed in the space of the housing, a battery that at least partially faces the PCB, a bracket that surrounds at least one face of the battery, and an elastic structure disposed between the battery and the bracket and located on an edge region of the battery.

In accordance with another aspect of the disclosure, the elastic structure may include an elastic member, a first adhesive member disposed on a first face of the elastic member that faces the first direction, and a second adhesive member disposed on a second face of the elastic member that faces the second direction, and the first adhesive member and the second adhesive member may be located such that the first adhesive member and the second adhesive member do not overlap at least in part, in a plane extending through the first adhesive member, the elastic member, and the second adhesive member.

In accordance with another aspect of the disclosure, an electronic device is provided. The electronic device includes a housing including a first plate, a second plate that faces the first plate, and a side member that surrounds a space between the first and second plates, a PCB disposed adjacent to the first plate in the space of the housing, a battery that at least partially faces the PCB, and a bracket that surrounds at least one face of the battery. The PCB or the first plate may be mounted on at least a region of the bracket, so that the PCB and the battery may be at least partially spaced apart from each other.

In accordance with another aspect of the disclosure, an electronic device is provided. The electronic device includes a housing including an upper structure and a lower structure which are coupled to each other so as to form an inner space, a PCB located within the space and connected to the upper structure, a bracket located within the space between the PCB and the underlying structure, a wireless communication circuit configured to provide wireless communication using a low power wide area network (LPWAN) and provided on the PCB, a battery electrically connected to the PCB, located in the space between the PCB and the bracket, and mounted on the bracket, an elastic member located between the battery and the bracket, at least one first adhesive member disposed between the battery and the elastic member to be in contact with the battery and the elastic member, and at least one second adhesive member disposed between the bracket and the elastic member to be in contact with the bracket and the elastic member.

A battery mounting structure according to various embodiments and an electronic device including the battery mounting structure are capable of providing the mounting structure as an elastic structure so as to protect the battery from an external impact applied to the electronic device according to elastic deformation and damping effect.

A battery mounting structure according to various embodiments and an electronic apparatus including the battery mounting structure are capable of reducing movement between the battery mounting space and the battery by mounting an elastic structure for fixing the battery to the battery mounting space.

A battery mounting structure according to various embodiments and an electronic device including the battery mounting structure are capable of protecting the battery by providing a spacing distance between a deformable region of the battery and devices adjacent to the battery.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 21 is a table for determining a communication method according to an attribute of data according to various embodiments of the disclosure;

Throughout the drawings, it should be noted that like reference numbers are used to depict the same or similar elements, features, and structures.

DETAILED DESCRIPTION

Figure 1:
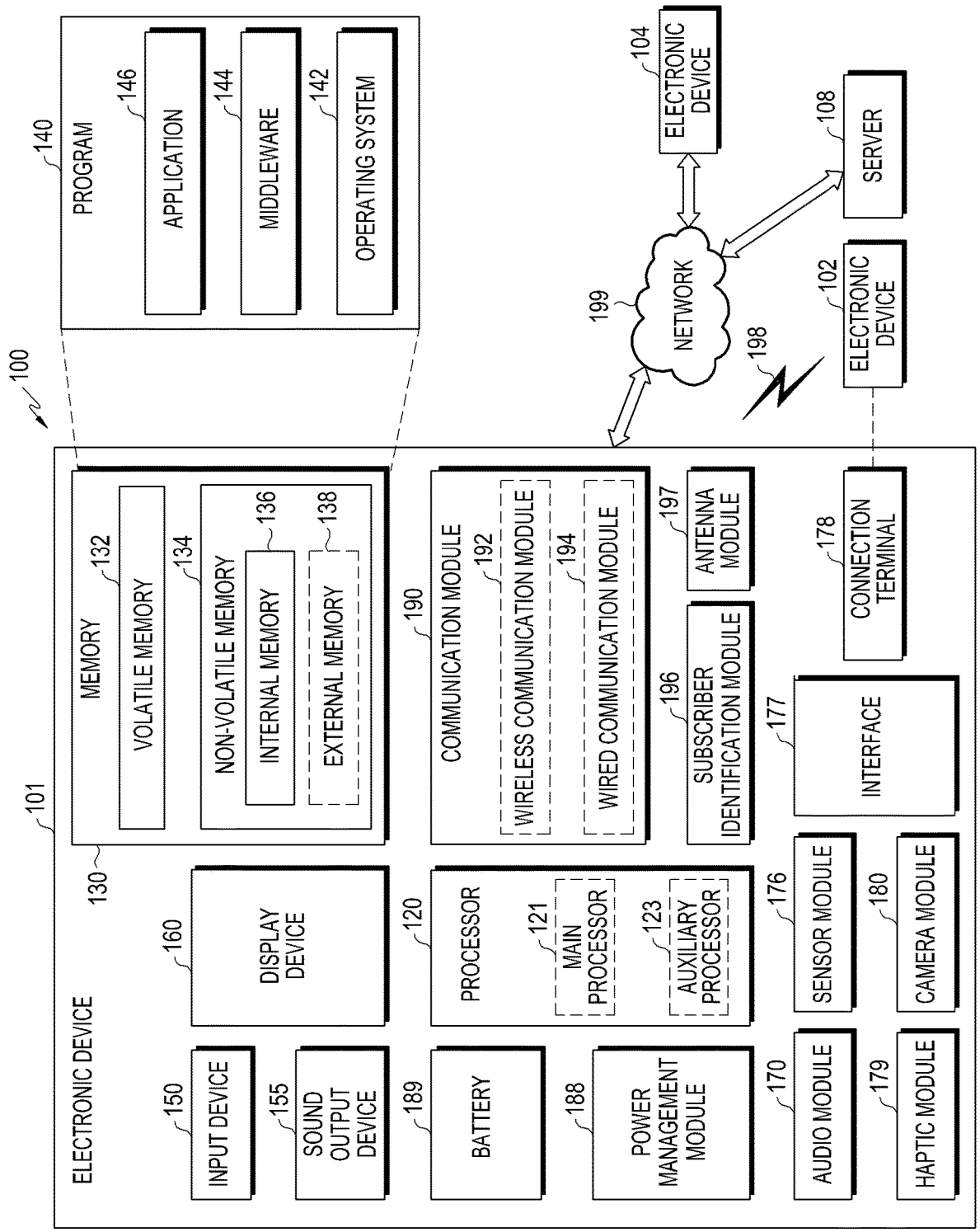
FIG. 1 is a block diagram illustrating an electronic device within a network environment according to various embodiments of the disclosure.

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

The electronic device according to various embodiments disclosed herein may be various types of devices. The electronic device may, for example, include at least one of a portable communication device (e.g., smartphone) a computer device, a portable multimedia device, a portable medical device, a camera, a wearable device, and a home appliance. The electronic device according to one embodiment is not limited to the above described devices.

The embodiments and the terms used therein are not intended to limit the technology disclosed herein to specific forms, and should be understood to include various modifications, equivalents, and/or alternatives to the corresponding embodiments. In describing the drawings, similar reference numerals may be used to designate similar constituent elements. A singular expression may include a plural expression unless they are definitely different in a context. The terms "A or B", "one or more of A and/or B", "A, B, or C", or "one or more of A, B and/or C" may include all possible combinations of them. The expression "a first", "a second", "the first", or "the second" used in various embodiments may modify various components regardless of the order and/or the importance but does not limit the corresponding components. When an element (e.g., first element) is referred to as being "(functionally or communicatively) connected," or "directly coupled" to another element (second element), the element may be connected directly to the other element or connected to the other element through yet another element (e.g., third element).

The term "module" as used herein may include a unit consisting of hardware, software, or firmware, and may, for example, be used interchangeably with the term "logic", "logical block", "component", "circuit", or the like. The "module" may be an integrated component, or a minimum unit for performing one or more functions or a part thereof. For example, a module may be an application-specific integrated circuit (ASIC).

Various embodiments as described herein may be implemented by software (e.g., program 140) including an instruction stored in machine-readable storage media (e.g., internal memory 136 or external memory 138). The machine is a device that calls the stored instruction from the storage media and can operate according to the called instruction, and may include an electronic device (e.g., electronic device 101) according to the disclosed embodiments. The instruction, when executed by a processor (e.g., processor 120), may cause the processor to directly execute a function corresponding to the instruction or cause other elements to execute the function under the control of the processor. The instruction may include a code that is generated or executed by a compiler or interpreter. The machine-readable storage media may be provided in the form of non-transitory storage media. Here, the term "non-transitory" means only that the storage media is tangible without including a signal, irrespective of whether data is semi-permanently or transitorily stored in the storage media.

According to one embodiment, a method according to various embodiments disclosed herein may be provided in the manner of being included in a computer program product. A computer program product may be traded between a seller and a purchaser as a commodity. The computer program product may be distributed in the form of a machine-readable storage medium (e.g., a compact disc read only memory (CD-ROM)) or on-line via an application store (e.g., Play Store™). In the case of on-line distribution, at least a part of the computer program product may be temporarily stored in or temporarily produced from a storage medium such as a manufacturer's server, a server of an application store, or a memory of a relay server.

Each component (e.g., a module or a program) according to various embodiments may be configured as a single entity or a plurality of entities, and some of the aforementioned sub-components may be omitted, or other sub-components may be further included in various embodiments. Alternatively or additionally, some components (e.g., a module or a program) may be integrated as a single entity so as to perform the functions performed by respective components prior to integration in a similar or same manner. Operations performed by a module, a programming module, or other elements according to various embodiments may be executed sequentially, in parallel, repeatedly, or in a heuristic manner. At least some operations may be executed according to another sequence, may be omitted, or may further include other operations. Hereinafter, an electronic device according to various embodiments will be described with reference to the accompanying drawings. In the disclosure, the term "user" may indicate a person using an electronic device or a device (e.g., an artificial intelligence electronic device) using an electronic device.

FIG. 1 is a block diagram illustrating an electronic device 101 in a network environment 100, according to various embodiments of the disclosure.

Referring to FIG. 1, the electronic device 101 in the network environment 100 may communicate with an electronic device 102 via a first network 198 (e.g., short-range wireless communication), or may communicate with an electronic device 104 or a server 108 via a second network 199 (e.g., long-range wireless communication). According to an embodiment, the electronic device 101 may communicate with the electronic device 102 via the connection terminal 178. According to one embodiment, the electronic device 101 may include a processor 120, a memory 130, an input device 150, a sound output device 155, a display device 160, an audio module 170, a sensor module 176, an interface 177, a haptic module 179, a camera assembly 180, a power management module 188, a battery 189, a communication module 190, a subscriber identification module 196, and an antenna module 197. In some embodiments, at least one of these components (e.g., the display device 160 or the camera assembly 180) may be omitted from the electronic device 101 or another component may be added to the electronic device 101. In some embodiments, some components may be implemented in an integrated form like, for example, the sensor module 176 (e.g., a fingerprint sensor, an iris sensor, or an illuminance sensor), which is embedded in, for example, the display device 160 (e.g., a display).

The processor 120 may control one or more other components (e.g., a hardware or software component) of the electronic device 101, which are connected to the processor 120, and may perform various data processing and arithmetic operations by driving, for example, software (e.g., a program 140). The processor 120 may load instructions or data, which are received from other components (e.g., the sensor module 176 or the communication module 190), into a volatile memory 132 so as to process the instructions or data, and may store the resulting data into a non-volatile memory 134. According to one embodiment, the processor 120 may include a main processor 121 (e.g., a central processing unit or an application processor (AP)), and an auxiliary processor 123, which operates independently from the main processor 121, additionally or alternatively uses a lower power than the main processor 121, or includes an auxiliary processor 123 specialized for a designated function (e.g., a graphic processor device, an image signal processor, a sensor hub processor, or a communication processor). Here, the auxiliary processor 123 may be operated separately from the main processor 121 or in the manner of being embedded with the main processor 121.

In this case, the auxiliary processor 123 may control at least some functions or states associated with at least one of the components of the electronic device 101 (e.g., the display device 160, the sensor module 176, or the communication module 190), on behalf of the main processor 121, for example, while the main processor 121 is in an inactive (e.g., sleep) state, or together with the main processor 121 while the main processor 121 is in an active (e.g., application execution) state. According to one embodiment, the auxiliary processor 123 (e.g., an image signal processor or a communication processor) may be implemented as some of other functionally related components (e.g., the camera assembly 180 or the communication module 190). The memory 130 may store various data used by at least one component (e.g., the processor 120 or the sensor module 176) of electronic device 101, for example, software (e.g., the program 140) and input or output data for commands which are associated with the software. The memory 130 may include a volatile memory 132 or a non-volatile memory 134.

The program 140 may be software stored in the memory 130 and may include, for example, an operating system 142, middleware 144, or application 146.

The input device 150 is a device from the outside (e.g., user) for receiving commands or data to be used in a component (e.g., the processor 120) of the electronic device 101, and may include, for example, a microphone, a mouse, or a keyboard.

The sound output device 155 is a device for outputting a sound signal to the outside of the electronic device 101. The sound output device 155 may include, for example, a speaker for general use such as multimedia reproduction or sound reproduction and a receiver used only for telephone reception. According to one embodiment, the receiver may be formed integrally with or separately from the speaker.

The display device 160 is a device for visually providing information to a user of the electronic device 101 and may include, for example, a display, a hologram device, or a projector and a control circuit for controlling the corresponding device. According to one embodiment, the display device 160 may include a touch circuit or a pressure sensor capable of measuring the intensity of the pressure on the touch.

The audio module 170 may bidirectionally convert sound and electrical signals. According to one embodiment, the audio module 170 may acquire sound through the input device 150 or may output sound through the sound output device 155 or an external electronic device (e.g., the electronic device 102 (e.g., a speaker or headphone)) connected with the electronic device 101 in a wireless or wired manner.

The sensor module 176 may generate an electrical signal or a data value corresponding to an internal operating state (e.g., power or temperature) of the electronic device 101 or an external environmental condition. The sensor module 176 may include, for example, a gesture sensor, a gyro sensor, an atmospheric pressure sensor, a magnetic sensor, an acceleration sensor, a grip sensor, a proximity sensor, a color sensor, an IR (infrared) sensor, a biometric sensor, a temperature sensor, a humidity, or an illuminance sensor.

The interface 177 may support a designated protocol that may be connected to an external electronic device (e.g., the electronic device 102) in a wired or wireless manner. According to one embodiment, the interface 177 may include a high definition multimedia interface (HDMI), a universal serial bus (USB) interface, a secure digital (SD) card interface, or an audio interface.

The connection terminal 178 may be a connector capable of physically interconnecting the electronic device 101 and an external electronic device (e.g., the electronic device 102), such as an HDMI connector, a USB connector, an SD card connector, or an audio connector (e.g., a headphone connector).

The haptic module 179 may convert an electrical signal into a mechanical stimulus (e.g., vibration or motion) or an electrical stimulus that the user can perceive through a tactile or kinesthetic sense. The haptic module 179 may include, for example, a motor, a piezoelectric element, or an electrical stimulation device.

The camera assembly 180 is capable of capturing a still image and a video image. According to one embodiment, the camera assembly 180 may include one or more lenses, an image sensor, an image signal processor, or a flash.

The power management module 188 is a module for managing power supplied to the electronic device 101, and may be configured as at least a part of, for example, a power management integrated circuit (PMIC).

The battery 189 is a device for supplying power to at least one component of the electronic device 101 and may include, for example, a non-rechargeable primary battery, a rechargeable secondary battery, or a fuel cell.

The communication module 190 may establish a wired or wireless communication channel between the electronic device 101 and an external electronic device (e.g., the electronic device 102, the electronic device 104, or the server 108) and may support communication via the established communication channel. The communication module 190 may include a processor 120 (e.g., an AP) and one or more communication processors, which are independently operated and support wired communication or wireless communication. According to one embodiment, the communication module 190 may include a wireless communication module 192 (e.g., a cellular communication module, a short range wireless communication module, or a global navigation satellite system (GNSS) communication module) or a wired communication module 194 (e.g., a local area network (LAN) communication module or a power line communication module), and may communicate with an external electronic device via a first network 198 (e.g., a short-range communication network, such as Bluetooth, Wi-Fi direct, or infrared data association (IrDA)) or a second network 199 (e.g., a long-range communication network, such as a cellular network, the Internet, or a computer network (e.g., a LAN or a wide area network (WAN))), using a corresponding communication circuit among the above-mentioned communication circuits. Various types of communication module 190 described above may be implemented as a single chip or may be implemented as separate chips, respectively.

According to one embodiment, the wireless communication module 192 may identify and authenticate the electronic device 101 within the communication network using the user information stored in the subscriber identification module 196.

The antenna module 197 may include one or more antennas configured to transmit/receive signals or power to/from the outside. According to one embodiment, the communication module 190 (e.g., the wireless communication module 192) may transmit/receive signals to/from an external electronic device via an antenna suitable for the communication scheme thereof.

Among the components described above, some components may be connected to each other via a communication scheme (e.g., a bus, a general-purpose input/output (GPIO), a serial peripheral interface (SPI), or a mobile industry processor interface (MIPI)), and may exchange signals (e.g., commands or data) therebetween.

According to one embodiment, the commands or data may be transmitted or received between the electronic device 101 and the external electronic device 104 via the server 108 connected to the second network 199. Each of the electronic devices 102 and 104 may be of a type, which is the same as or different from the electronic device 101. According to one embodiment, all or some of the operations executed in the electronic device 101 may be executed in another external electronic device or a plurality of external electronic devices. According to one embodiment, in the case where the electronic device 101 should perform a certain function or service automatically or by a request, the electronic device 101 may request at least some functions, which are associated with the function or service, from an external electronic device, instead of, or in addition to, executing the functions or the service by itself. The external electronic device, which receives the request, may execute the requested functions or additional functions, and may transmit the results to the electronic device 101. The electronic device 101 may provide the requested functions or services by processing the received results as they are or additionally. For this purpose, for example, a cloud computing technique, a distributed computing technique, or a client-server computing technique may be used.

Figure 2:
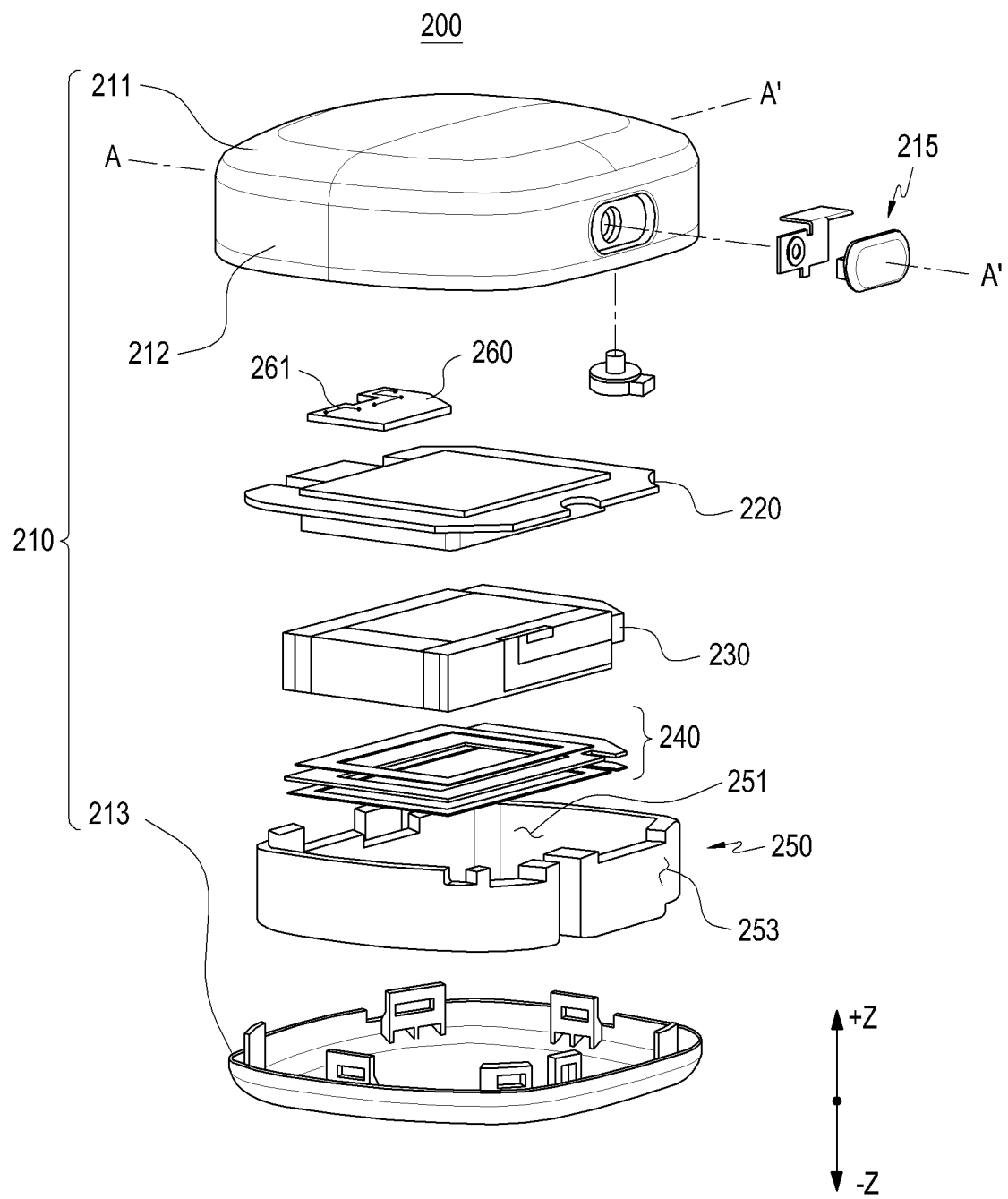
FIG. 2 is an exploded perspective view illustrating an electronic device 200 according to one of various embodiments of the disclosure.
Figure 3:
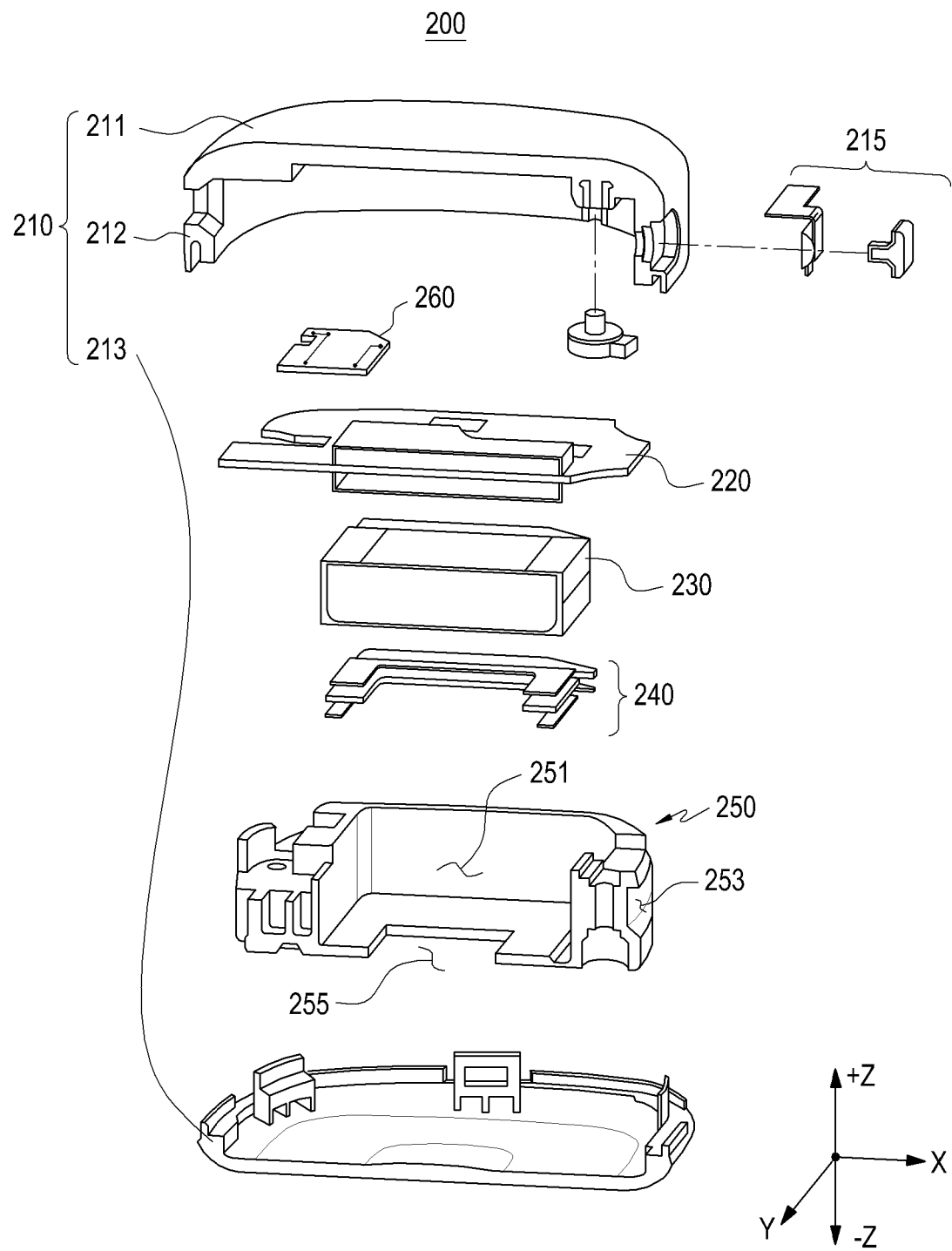
FIG. 3 is an exploded and sectional perspective view illustrating the electronic device 200, which is cut along line A-A' in FIG. 2 according to one of various embodiments of the disclosure.

FIG. 2 is an exploded perspective view illustrating an electronic device 200 according to one of various embodiments of the disclosure. FIG. 3 is an exploded and sectional perspective view illustrating the electronic device 200, which is cut along line A-A' in FIG. 2 according to one of various embodiments of the disclosure.

Referring to FIGS. 2 and 3, according to one of various embodiments, the electronic device 200 may include a housing 210, a printed circuit board (PCB) 220, a battery 230, a bracket 250, and an elastic structure 240.

According to various embodiments, the housing 210 may include a first plate 211 disposed to face the front side (e.g., a first (+Z) direction), a second plate 213 disposed to face a rear side opposite the front side (e.g., a second (−Z) direction) that is opposite the front side, and a side member 212 disposed between the first plate 211 and the second plate 213.

As another example, the housing 210 may include an upper structure and a lower structure, and the upper structure and the lower structure may be coupled to each other so as to form an inner space. The upper structure may include a plate facing the first (+Z) direction (e.g., the first plate 211) and a side face (e.g., the side member 212) extending from the plate, and the lower structure may include a plate facing the second (−Z) direction (e.g., the second plate 213) and a side face extending from the plate.

According to one embodiment, the first plate 211 may form a front cover of the electronic device 200 and the second plate 213 may form a rear cover of the electronic device 200. In addition, the side member 212 may be configured to enclose at least a portion formed between the first plate 211 and the second plate 213.

According to one embodiment, the first plate 211 and the second plate 213 may be configured to include at least one of a structure in which a curved portion is partially included and a flexible shape in addition to being formed in a flat plate shape. As another example, the outer face of the side member 212 may also be formed in a shape including at least one of a curved portion and a flexible shape. Accordingly, when a button structure 215 is disposed on the front face or a side face of the electronic device 200, the user may easily click the button structure in the state of gripping the electronic device 200.

According to various embodiments, the housing 210 is configured to accommodate various electronic components and the like, and at least a portion of the housing 210 (e.g., a region of the first plate 211, the second plate 213, or the side member 212) may be made of a conductive material. For example, the side member 212 of the housing 210 may have a rectangular shape including four side faces, and at least a portion of the side member 212, which is exposed to the outside of the housing 210, may be made of a conductive material. At least a portion of the conductive material of the housing 210 (e.g., the side member 212) may be utilized as an antenna device (e.g., a radiating conductor). As another example, at least a portion of the housing 210 (e.g., the side member 212) may be insulated from other portions of the bracket 250 and may be electrically connected to the communication module so as to be utilized as an antenna device.

According to one embodiment, the PCB 220 and/or the battery 230 may be accommodated in the housing 210. For example, on the PCB 220, a processor (e.g., the processor 120 of FIG. 1), a communication circuit (e.g., the communication module 190 of FIG. 1), various interfaces (e.g., the interface 177 of FIG. 1), a power management module (e.g., the power management module 188 of FIG. 1), or the like may be mounted in the form of an integrated circuit chip, and a control circuit may also be configured as an integrated circuit chip and may be mounted on the PCB 220. For example, the control circuit may be a portion of the above-described processor or communication circuit.

According to various embodiments, a bracket 250 may be mounted within the housing 210. The bracket 250 may be made of a metallic material and/or a non-metallic material such as a polymer, and may be disposed between the first plate 211 and the second plate 213 of the housing 210.

According to one embodiment, the bracket 250 may reinforce the rigidity of the electronic device 200. For example, the housing 210 may be formed with a plurality of openings or recesses depending on the arrangement of the electronic components inside the electronic device 200, which may reduce the rigidity of the housing 210 or the electronic device 200. The bracket 250 may be mounted within and bound to the housing 210 so as to improve the rigidity of the housing 210 or the electronic device 200.

Although not illustrated in detail in the drawings, according to various embodiments, various structures may be disposed on the surfaces of the housing 210 and the bracket 250 according to the arrangement of the electronic components disposed inside the electronic device 200, a binding structure between the housing 210 and the bracket 250, or the like. For example, a space may be formed in the housing 210 and/or the bracket 250 so as to accommodate integrated circuit chips mounted on the PCB 220. The space for accommodating integrated circuit chips may be formed of in the form of a recess or may be formed by a rib or the like that surrounds the integrated circuit chips. According to various embodiments, corresponding fastening structures and fastening holes may be formed in the housing 210 and the bracket 250. For example, when fastening members such as screws are fastened to a fastening member or the fastening holes, the housing 210 and the bracket 250 may be bound with each other in the state in which the housing 210 and the bracket 250 face each other, or in the state in which the bracket 250 is accommodated in the housing 210.

According to one embodiment, the bracket 250 may have an accommodation space 251 formed to accommodate the battery 230. The battery 230 mounted in the accommodation space 251 may be disposed parallel to the PCB 220 without being in contact with the PCB 220. The battery 230 may be electrically connected to the PCB 220. For example, the battery 230 may be mounted in the accommodation space 251 of the bracket 250, and a side member 253 (e.g., an edge region) of the bracket 250 may be configured to surround the side face of the battery 230. The height of the side member 253 (e.g., the edge region) of the bracket 250 (e.g., the length of the side face of the bracket on the Z-axis) may be larger than the height of the battery 230 (e.g., the length of the side face of the battery on the Z-axis). The first plate 211 and the PCB 220 may be fastened to each other through a screw or the like. The side member 253 of the bracket 250 may be mounted on the PCB 220 and/or a face of the first plate 211 of the housing 210, so that the PCB 220 and the battery 230 can be spaced apart from each other without being in contact with each other. As another example, the bracket 250 may include an opening 255 in a central region of one face that faces the second plate 213. The opening 255 is disposed such that the face of the battery, which faces the second (−Z) direction in the state where the battery is mounted on the bracket 250, faces the inner face of the second plate 213. The opening 255 may prevent the bottom face the battery from colliding with the inner face of the second plate 213.

According to various embodiments, the battery 230 is a device for supplying power to at least one component of the electronic device 200 and may include, for example, a non-rechargeable primary battery, a rechargeable secondary battery, or a fuel cell. The battery 230 may be integrally disposed within the electronic device 200, or may be mounted to be detachable from the electronic device 200.

According to various embodiments, a radiation structure 260 including a conductive pattern 261 may be electrically connected to the PCB 220 so as to be mounted within the housing 210. For example, the radiation structure 260 may be positioned between the first plate 211 and the bracket 250 or between the rear cover (e.g., second plate 213) and the bracket 250. The conductive pattern 261 may be an antenna configured to transmit and receive radio waves or to generate a magnetic field. The radiation structure 260 may be configured to perform wireless communication using a low power wide area network (LPWAN). For example, the LPWAN may include a narrowband internet of things (NBIOT) network.

According to one embodiment, the conductive pattern 261 may be a partial region of the radiation structure 260 formed by a laser direct structuring (LDS) scheme. As another example, the conductive pattern 261 may be a portion of a metal that forms at least a portion of the housing 210 (e.g., the side member 212) of the electronic device.

According to one embodiment, radio waves transmitted/received through the conductive pattern 261 of the radiation structure 260 or magnetic fields generated by the conductive pattern 261 of the radiation structure 260 may pass through the plate (e.g., the first plate 211 or the second plate 213).

According to various embodiments, the elastic structure 240 may be mounted inside the bracket 250 so as to elastically support the battery 230. The elastic structure 240 may be disposed to be opposite the PCB 220 with respect to the battery 230 and may include, on both sides thereof, adhesive members capable of adhering to the battery 230 and the bracket 250. The elastic structure 240 will be described in detail below.

According to various embodiments, the second plate 213 may be disposed on the second (−Z) direction of the PCB 220 and the battery 230 while covering at least a portion of the bracket 250. The second plate 213 may form the appearance of the electronic device 200 together with the side member 212 and the first plate 211. According to one embodiment, the second plate 213 may be detachably coupled to the bracket 250, and a user may replace a storage medium (e.g., a subscriber identification module (SIM card) or an SD card) or the battery 230 in the state where the second plate 213 is separated. As another example, the second plate 213 is formed as a uni-body with the bracket 250, so that the user may be restricted from separating from the bracket 250 arbitrarily.

Figure 4:
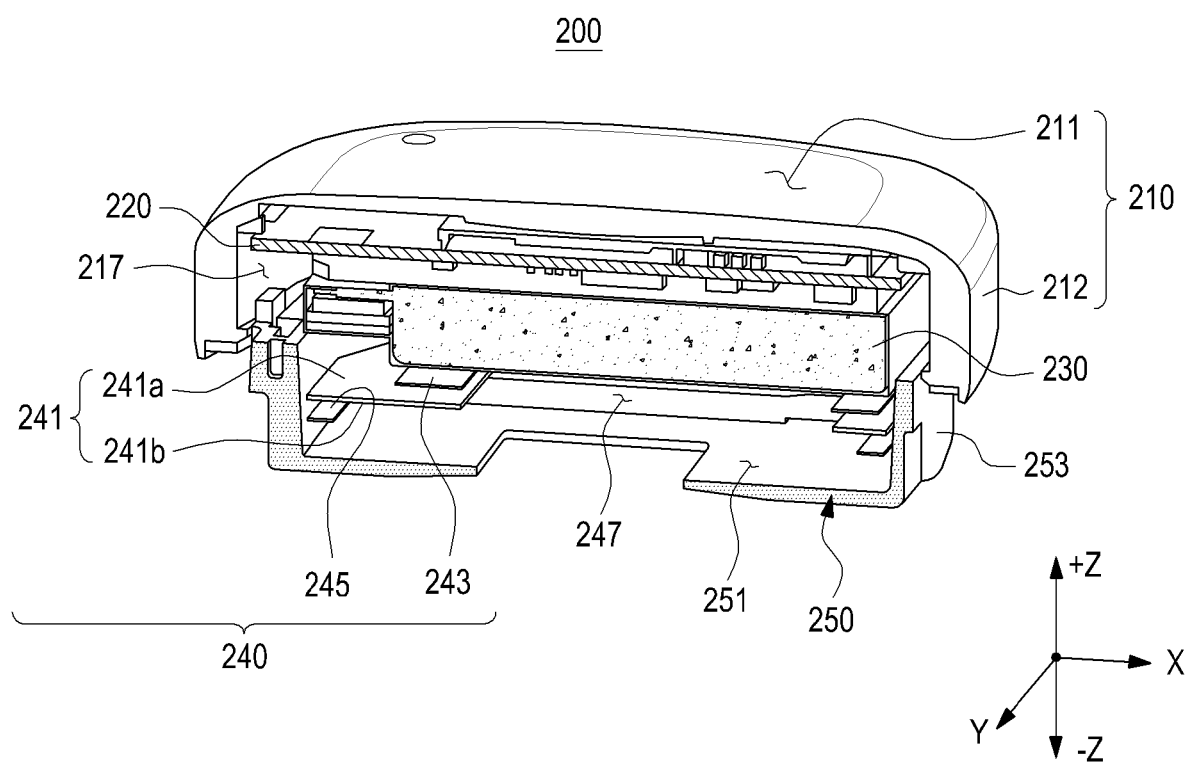
FIG. 4 is a cross-sectional view illustrating an arrangement relationship before respective components of the electronic device 200 are assembled according to one of various embodiments of the disclosure.

FIG. 4 is a cross-sectional view illustrating an arrangement relationship before respective components of the electronic device 200 are assembled according to one of various embodiments of the disclosure. The structure of the electronic device 200 of FIG. 4 may be partly or wholly the same as the structure of the electronic device 200 of FIGS. 2 and 3.

Referring to FIG. 4, according to one of various embodiments, the electronic device 200 may include a housing 210, a PCB 220, a battery 230, a bracket 250, and an elastic structure 240.

According to various embodiments, the electronic device 200 may accommodate the PCB 220 and the bracket 250 in the inner space 217 formed by the housing 210 from the upper side (e.g., toward the second (−Z) direction). The bracket 250 may support the housing 210, and may include an accommodation space 251 configured to mount electronic components therein. The battery 230 and the elastic structure 240 may be stacked and arranged in the accommodation space 251 of the bracket 250 from the upper side (e.g., toward the second (−Z) direction).

According to various embodiments, the PCB 220 may be disposed adjacent to the first plate 211 of the housing 210.

For example, the PCB 220 may be fixed to one face of the first plate 211 using a screw or the like.

According to various embodiments, the PCB 220 and the battery 230 may be disposed to at least partially face each other, and may be spaced apart from each other with a predetermined gap therebetween. For example, a support member (the support member 321 of FIGS. 7 and 8) may be disposed between a portion of the battery 230 and the PCB 220, so that the remaining region of the battery 230 may maintain the state of being continuously spaced apart from the PCB 220. As another example, although not illustrated in detail in the drawings, the inner face of the side member 212 of the housing 210 may be formed to at least partially protrude toward the inner space 217 or a rib or the like, which surrounds the PCB 220, may be formed on the inner face of the side member 212, thereby supporting the PCB 220. As another example, the side member 253 (e.g., an edge region) formed on the upper portion of the bracket 250 and disposed to face the first (+Z) direction may support a part of the PCB 220 such that the PCB 220 can be supported to be spaced apart from the battery 230 without being in contact with the battery 230. As another example, at least a portion of the side member of the battery 230 may be mounted or supported on the PCB 220 and/or the face of the first plate 211 of the housing 210. Since the height of the side member 253 of the bracket 250 (e.g., the length of the side face of the bracket on the Z-axis) is larger than the height of the battery 230 (e.g., the length of the side face of the battery on the Z-axis), the PCB 220 and the battery 230 may be spaced apart from each other.

As the battery 230 supplies power, a partial region (e.g., the central region) thereof may swell, and it may be advantageous to prevent contact with the other electronic components in order to ensure the stability of the electronic device 200. The PCB 220 disposed above the battery 230 according to the disclosure is supported by the side member 212 of the housing 210 and/or the bracket 250 so as to maintain a predetermined gap from the battery 230, so that the stability of the electronic device 200 can be provided.

According to various embodiments, the elastic structure 240 may be mounted in the accommodation space 251 in the bracket 250 together with the battery 230, and may be disposed to be opposite the PCB 220 with respect to the battery 230. The elastic structure 240 may be formed such that the elastic structure 240 is only in contact with the edge region of the face of the battery 230 facing the second (−Z) direction, and is not in contact with the remaining region. For example, in order to prevent contact with the central region of the battery 230 described above, the elastic structure 240 may be fabricated in a shape that surrounds the edge region of the battery 230, and an opening 247 may be formed in the central region thereof. The central region of the battery 230 may be spaced apart from and the bracket 250 by the thickness of the elastic structure 240 so as to ensure stability of the electronic device 200.

According to various embodiments, the elastic structure 240 may include an elastic member 241 and at least one adhesive member 243 or 245.

According to one embodiment, the elastic member 241 has a plate shape including an opening 247 therein and is capable of protecting the battery 230 from an external impact. For example, the elastic member 241 may include a first face 241a that faces the first (+Z) direction and a second face 241b that faces the second (−Z) direction opposite the first (+Z) direction, and may be fabricated to contain an elastic material. The elastic material may include at least one of, for example, foam, sponge, and rubber. The first face 241a may form a closed line such as a square ring with an open center to surround only the edge region of the battery 230, and the second face 241b may face the bracket 250. However, the structure of the elastic member 241 is not limited to the closed line such as the square ring, and may be formed in various shapes with an open center, in a line shape in which some regions are opened, or in a plurality of segmented pieces that cover different portions of the edge region of the battery 230.

According to one embodiment, the outer circumference of the elastic member 241 may be formed to be larger than the circumference of the battery 230 and may be formed to have a size corresponding to the accommodation space 251 in the bracket 250. For example, the length of the outer circumference of the elastic member 241 is equal to or at least partially equal to the size of the accommodation space 251, so that even in the case where the battery 230 is designed to be substantially smaller than the accommodation space 251, the battery 230 fixed to the elastic member 241 can be hindered from moving in a plane (e.g., an X-Y plane) in the accommodation space 251 in the bracket 250.

According to one embodiment, when an external impact is applied to the electronic device 200, the elastic member 241 disperses or reduces the impact transmitted to the battery 230 disposed therein due to the elastic material thereof, thereby ensuring stability.

According to one embodiment, the adhesive members 243 and 245 may include a first adhesive member 243 disposed on the first face 241a of the elastic member 241 and a second adhesive member 245 disposed on the second face 241b of the elastic member 241. The first adhesive member 243 is capable of attaching the battery 230 to the first face 241a of the elastic member 241, and the second adhesive member 245 is capable of attaching the elastic member 241 to the bracket 250. The first adhesive member 243 and the second adhesive member 245 may include an elastic material and is capable of suppressing the impact caused by the external impact from being transferred to the battery together with the elastic member 241.

According to one embodiment, the first adhesive member 243 and the second adhesive member 245 may be designed to correspond to the shape of the elastic member 241. For example, the first adhesive member 243 and the second adhesive member 245 may have a plate shape including an opening so as not to overlap with the central region of the battery 230, and may form a closed line so as to surround the edge region of the battery 230. However, the disclosure is not limited thereto and the first adhesive member 243 and the second adhesive member 245 may include a plurality of segmented pieces covering different portions of the edge region of the battery 230.

According to one embodiment, the first adhesive member 243 and the second adhesive member 245 may be formed to have different sizes. For example, the length of the circumference of the first adhesive member 243 may be smaller than the length of the circumference of the second adhesive member 245. As another example, the length of the circumference of the second adhesive member 245 may be smaller than the length of the circumference of the first adhesive member 243. Hereinafter, the elastic structure according to the arrangement relationship of the first adhesive member 243 and the second adhesive member 245 will be described in detail.

Figure 5:
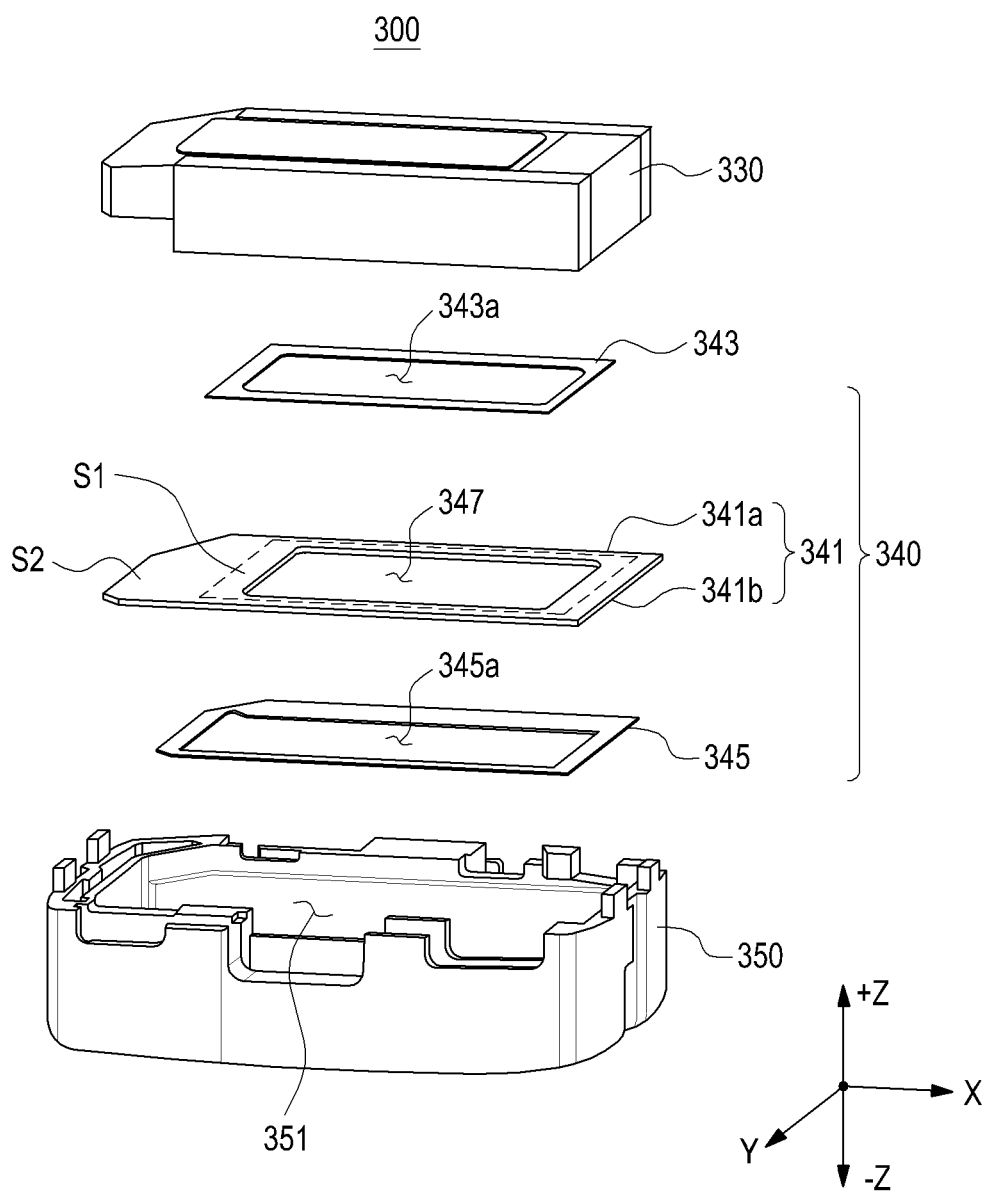
FIG. 5 is a perspective view illustrating an elastic structure 340 before a bracket 350 is disposed, according to various embodiments of the disclosure.
Figure 6A:
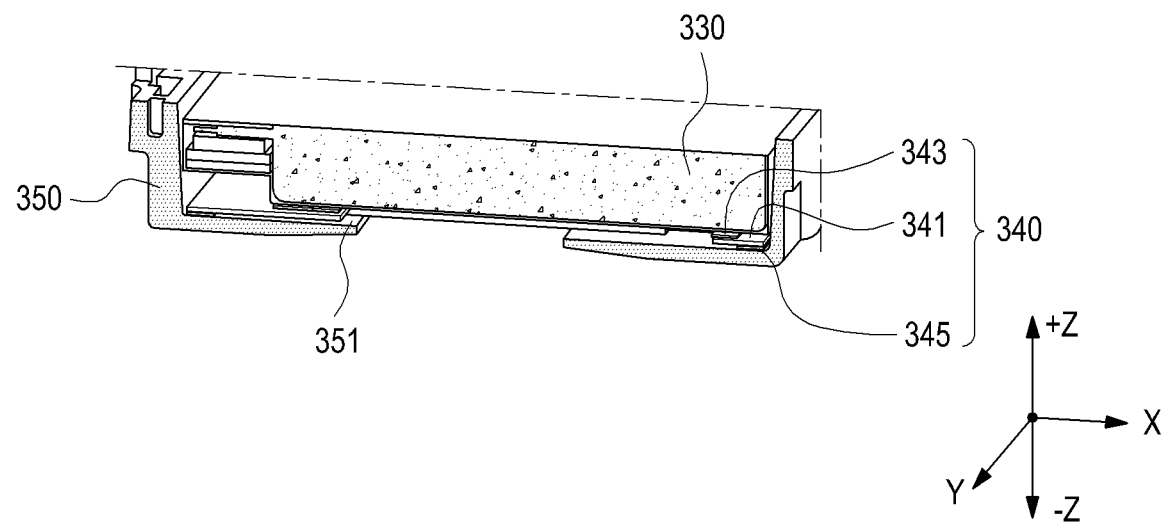
FIG. 6A is a cross-sectional view illustrating the coupled state of respective components of the electronic device of FIG. 5, according to various embodiments of the disclosure.

FIG. 5 is a perspective view illustrating an elastic structure 340 before a bracket 350 is disposed, according to various embodiments of the disclosure. FIG. 6A is a cross-sectional view illustrating the coupled state of respective components of the electronic device of FIG. 5, according to various embodiments of the disclosure, and FIG. 6B is a perspective view illustrating the coupled state of the bracket and the elastic structure of FIG. 6A when viewed from the upper side according to various embodiments of the disclosure.

Figure 6B:
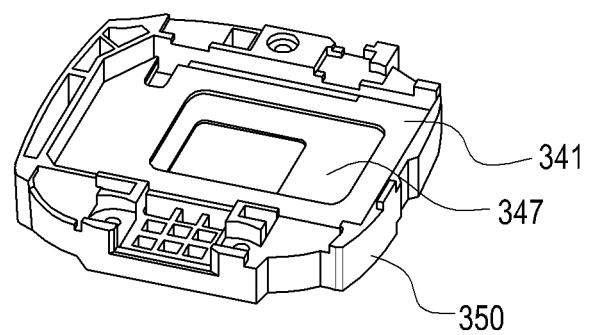
FIG. 6B is a perspective view illustrating the coupled state of the bracket and the elastic structure of FIG. 6A when viewed from the upper side according to various embodiments of the disclosure.

Referring to FIGS. 5, 6A, and 6B, according to one of various embodiments, an electronic device 300 may include a battery 330, a bracket 350, and an elastic structure 340. The structure of the battery 330, the elastic structure 340, and the bracket 350 of the electronic device 300 of FIGS. 5, 6A, and 6B may be partially or wholly the same as the structure of the battery 230, the elastic structure 240, and the bracket 250 of the electronic device 200 of FIGS. 2, 3, and 4.

According to various embodiments, the elastic structure 340 may include an elastic member 341 and at least one adhesive member 343 or 345.

According to one embodiment, the elastic member 341 has a plate shape including an opening 347 therein and may include a first face 341a that faces the first (+Z) direction and a second face 341b that faces the second (−Z) direction opposite the first (+Z) direction. The elastic member 341 may form a closed line to surround the edge region of the battery 330 and may have a size corresponding to the accommodation space 351 in the bracket 350. The elastic member 341 may include a first region S1 formed to surround (enclose) the opening 347 and a second region S2 formed to surround the edge region of the first region S1.

According to one embodiment, the adhesive members 343 and 345 may include a first adhesive member 343 disposed on the first face 341a of the elastic member 341 and a second adhesive member 345 disposed on the second face 341b of the elastic member 341.

According to one embodiment, the first adhesive member 343 and the second adhesive member 345 may be arranged to be staggered from each other when the electronic device is viewed in the second (−Z) direction such that the first adhesive member 343 and the second adhesive member 345 do not overlap each other on a plane (e.g., an X-Y plane). For example, the first adhesive member 343 may be disposed in the first region S1 of the elastic member 341, and the second adhesive member 345 may be disposed in the second region S2. The first adhesive member 343 and second adhesive member 345 may be arranged to support different regions of the elastic member 341, so that the amount of deformation of the elastic member 341 can be increased (see FIGS. 9 and 10). As another example, the first adhesive member 343 and the second adhesive member 345 may have a shape in which the center region is opened so as to correspond to the shape of the elastic member 341. For example, the opening 343a of the first adhesive member 343 and the opening 345a of the second adhesive member 345 may be made larger so as not to block at least a portion of the opening 347 of the elastic member 341.

However, the disclosure is not limited to the above embodiment. The first adhesive member 343 and the second adhesive member 345 may be disposed such that some areas on a plane (e.g., an X-Y plane) overlap each other when the electronic device is viewed in the second (−Z) direction. For example, the first adhesive member 343 may be disposed in a portion of the first region S1 and the second region S2 of the elastic member 341, or the second adhesive member 345 may be disposed in a portion of the second region S2 and the first region S1. The first adhesive member 343 may be disposed in a region wider than the first region S1 so as to improve the adhesive strength with the battery 330, and the second adhesive member 345 may be disposed in a region wider than the second region S2 so as to improve the adhesive strength with the bracket 350.

Figure 7:
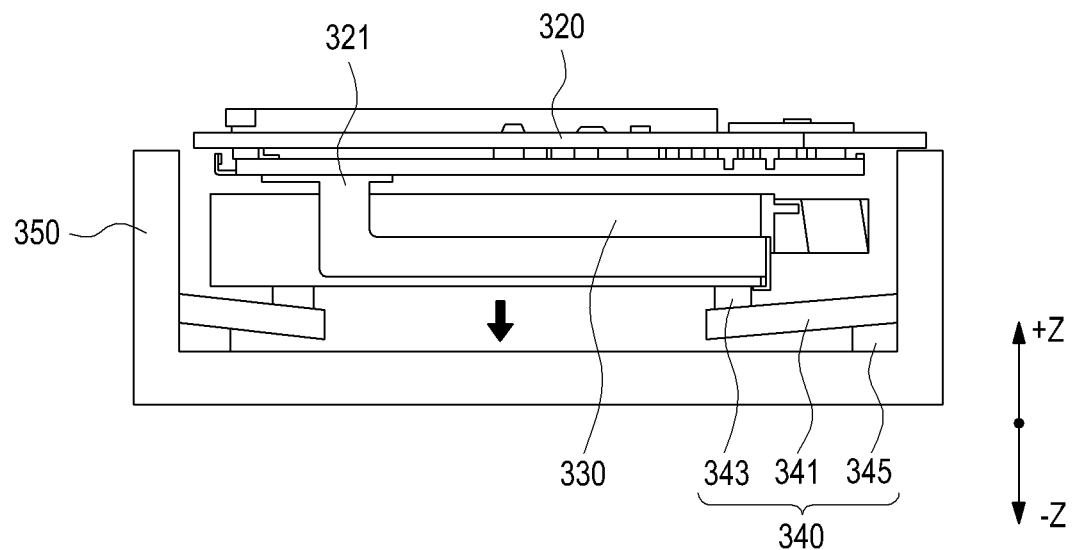
FIGS. 7 and 8 illustrate a modified mechanism of the elastic structure 340 of FIGS. 5, 6A, and 6B according to the various embodiments of the disclosure.
Figure 8:
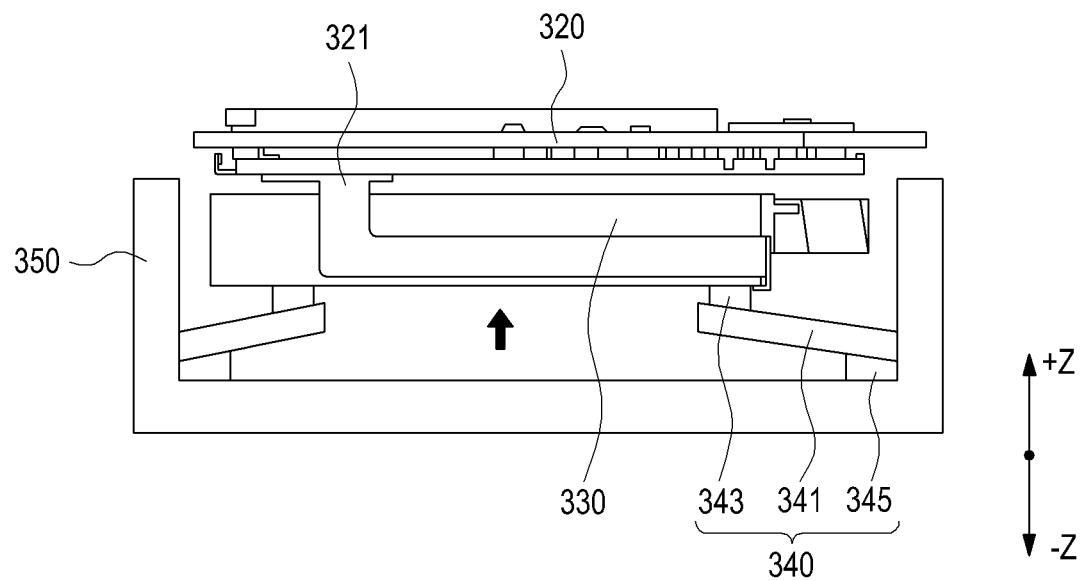

FIGS. 7 and 8 are cross-sectional views illustrating the operation of the elastic structure 340 bonded to the battery 330, according to various embodiments of the disclosure.

The structure of the battery 330, the elastic structure 340, and the bracket 350 of FIGS. 7 and 8 may be partially or wholly the same as the structure of the battery 230 or 330, the elastic structure 240 or 340, and the bracket 250 or 350 of the electronic device 200 or 300 of FIGS. 2, 3, 4, 5, and 6A and 6B.

FIGS. 7 and 8 illustrate a modified mechanism of the elastic structure 340 bonded to the battery 330 according to various embodiments of the disclosure. Referring to FIGS. 7 and 8, the first adhesive member 343 and the second adhesive member 345 may be arranged to be staggered from each other such that the first adhesive member 343 and the second adhesive member 345 may be disposed so as not to overlap each other. For example, the first adhesive member 343 may be disposed in the first region of the elastic member 341 (the first region S1 of FIG. 5), and the second adhesive member 345 may be disposed in the second region (the second region S2 of FIG. 5). As another example, the first adhesive member 343 may be disposed in the second region S2 of the elastic member 341, and the second adhesive member 345 may be disposed in the first region S1.

The coupling of the battery 330 and the elastic structure 340 in the bracket 350 according to various embodiments may minimize the movement of the battery 330 when an external impact is applied. According to one embodiment, the PCB 320 disposed above the battery 330 may maintain the state of being spaced apart from the battery 330 by a predetermined distance, according to one embodiment. For example, a support member 321 may be disposed between a region of the battery 330 and the PCB 320, so that the remaining region of the battery 330 can be continuously maintained in the state of being spaced apart from the PCB 220. The support member 321 may be disposed in the edge region of the battery 330, so that the support member 321 is capable of maintaining a space above the central region of the battery where deformation of the battery occurs and preventing the PCB 320 from colliding with the battery 330 which moves in the first (+Z) direction.

According to one embodiment, the elastic structure 340 disposed below the battery 330 is capable of continuously maintaining the state in which the battery 330 and the bracket 350 are spaced apart from each other by a predetermined distance, and of preventing the battery 330, which moves in the second (−Z) direction from colliding with the bottom surface of the bracket 350. The bracket 350 may further include an opening or a groove in the bottom face thereof so as to prevent the battery from colliding with the bottom face of the battery. As another example, the first adhesive member 343 may be disposed in the first region S1 on the top face of the elastic member 341 and the second adhesive member 345 may be disposed in the second region S2, so that the amount of movable deformation of the elastic member 341 can be increased. The deformation amount or the damping effect of the increased elastic structure 340 is capable of sequentially reducing an external impact of the battery 330. As another example, the stacked structure of the elastic structure 340 may disperse an external impact.

According to one embodiment, the arrangement of the elastic member 341 of the elastic structure 340 in the bracket 350 is capable of reducing the gap between the accommodation space 351 in the bracket 350 and the battery 330, so that it is possible to suppress the movable space on a plane. Accordingly, it is possible to protect the battery by limiting the horizontal movement.

Figure 9:
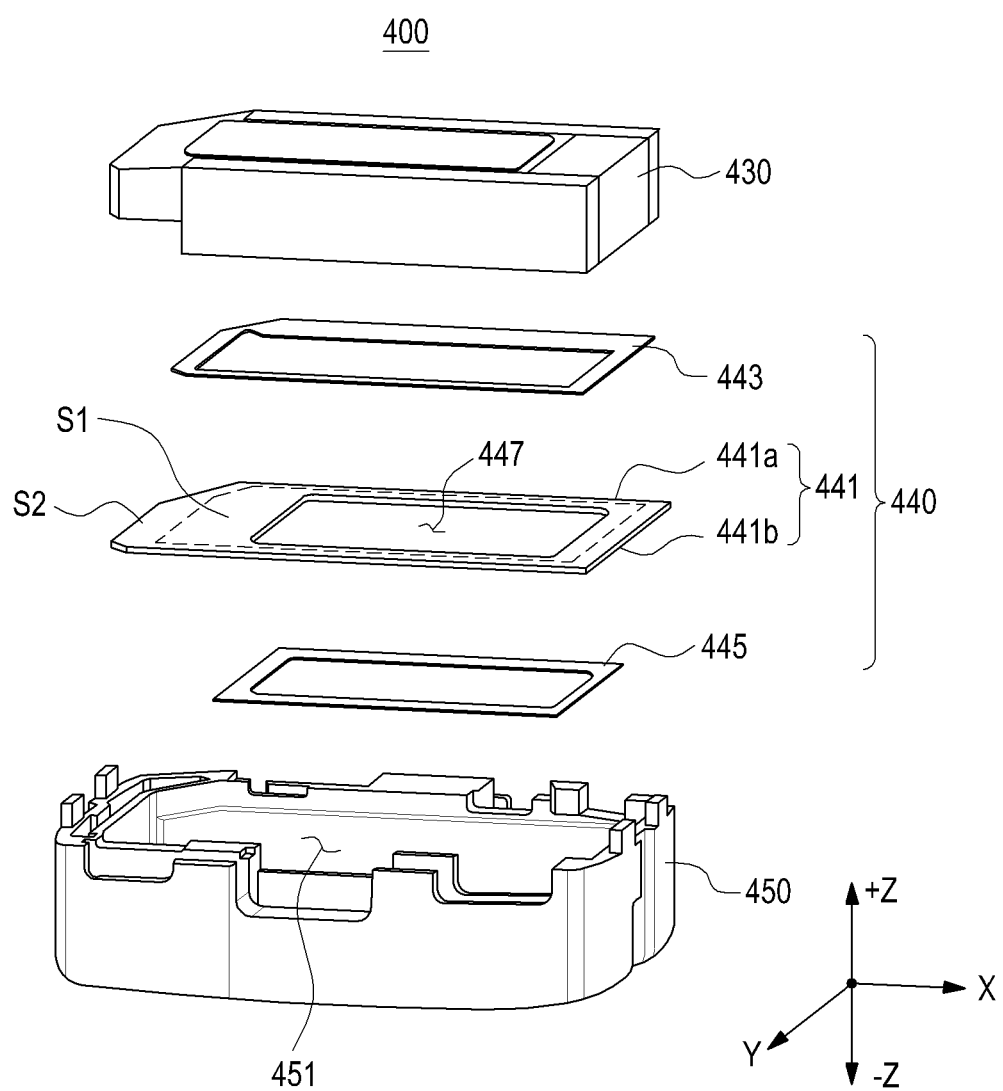
FIG. 9 is a perspective view illustrating an elastic structure 440 disposed on a bracket 450, according to various embodiments of the disclosure.
Figure 10:
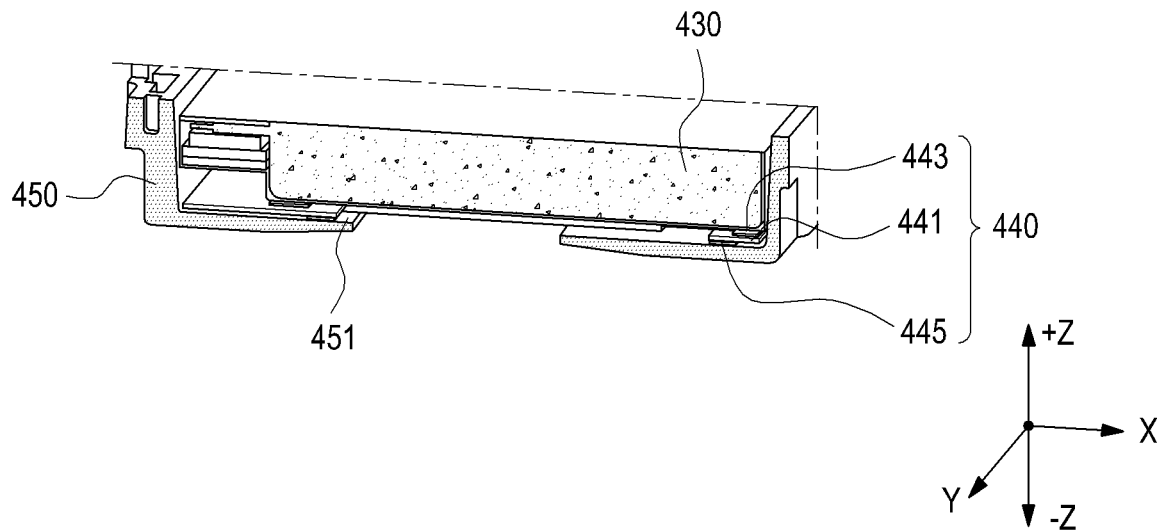
FIG. 10 is a cross-sectional view illustrating the coupled state of respective components of the electronic device of FIG. 9, according to various embodiments of the disclosure.

FIG. 9 is a cross-sectional perspective view illustrating an elastic structure 440 disposed on a bracket 450, according to various embodiments of the disclosure. FIG. 10 is a cross-sectional view illustrating the coupled state of respective components of the electronic device of FIG. 9, according to various embodiments of the disclosure.

Referring to FIGS. 9 and 10, an electronic device 400 according to one of various embodiments may include a battery 430, a bracket 450, and an elastic structure 440. The structure of the battery 430, the elastic structure 440, and the bracket 450 of the electronic device 400 of FIGS. 9 and 10 may be partially or wholly the same as the structure of the battery 230, the elastic structure 240, and the bracket 250 of the electronic device 200 of FIGS. 2, 3, and 4.

According to various embodiments, the elastic structure 440 may include an elastic member 441 and at least one adhesive member 443 or 445. According to one embodiment, the elastic member 441 has a plate shape including an opening 447 therein and may include a first face 441a that faces the first (+Z) direction and a second face 441b that faces the second (−Z) direction opposite the first (+Z) direction. The elastic member 441 may form a closed line to surround the edge region of the battery 430 and may have a size corresponding to the accommodation space 451 in the bracket 450. The elastic member 441 may include a first region S1 formed to surround (enclose) the opening 447 and a second region S2 formed to surround the edge region of the first region S1.

According to various embodiments, the adhesive members 443 and 445 may include a first adhesive member 443 disposed on the first face 441a of the elastic member 441 and a second adhesive member 445 disposed on the second face 441b of the elastic member 441. According to one embodiment, the first adhesive member 443 and the second adhesive member 445 may be arranged to be staggered from each other when the electronic device is viewed in the second (−Z) direction such that the first adhesive member 443 and the second adhesive member 445 do not overlap each other on a plane (e.g., an X-Y plane). For example, the first adhesive member 443 may be disposed in the second region S2 of the elastic member 441, and the second adhesive member 445 may be disposed in the first region S1. The first adhesive member 443 and the second adhesive member 445 may be arranged to support different regions of the elastic member 441, so that the amount of deformation of the elastic member 441 can be increased.

However, the disclosure is not limited to the above embodiment. The first adhesive member 443 and the second adhesive member 445 may be disposed such that some areas on a plane (e.g., an X-Y plane) overlap each other when the electronic device is viewed in the second (−Z) direction. For example, the first adhesive member 443 may be disposed in a portion of the second region S2 and the first region S1 of the elastic member 441, or the second adhesive member 445 may be disposed in a portion of the first region S1 and the second region S2. The first adhesive member 443 may be disposed in a region wider than the second region S2 so as to improve the adhesive strength with the battery 430, and the second adhesive member 445 may be disposed in a region wider than the first region S1 so as to improve the adhesive strength with the bracket 450.

Figure 11:
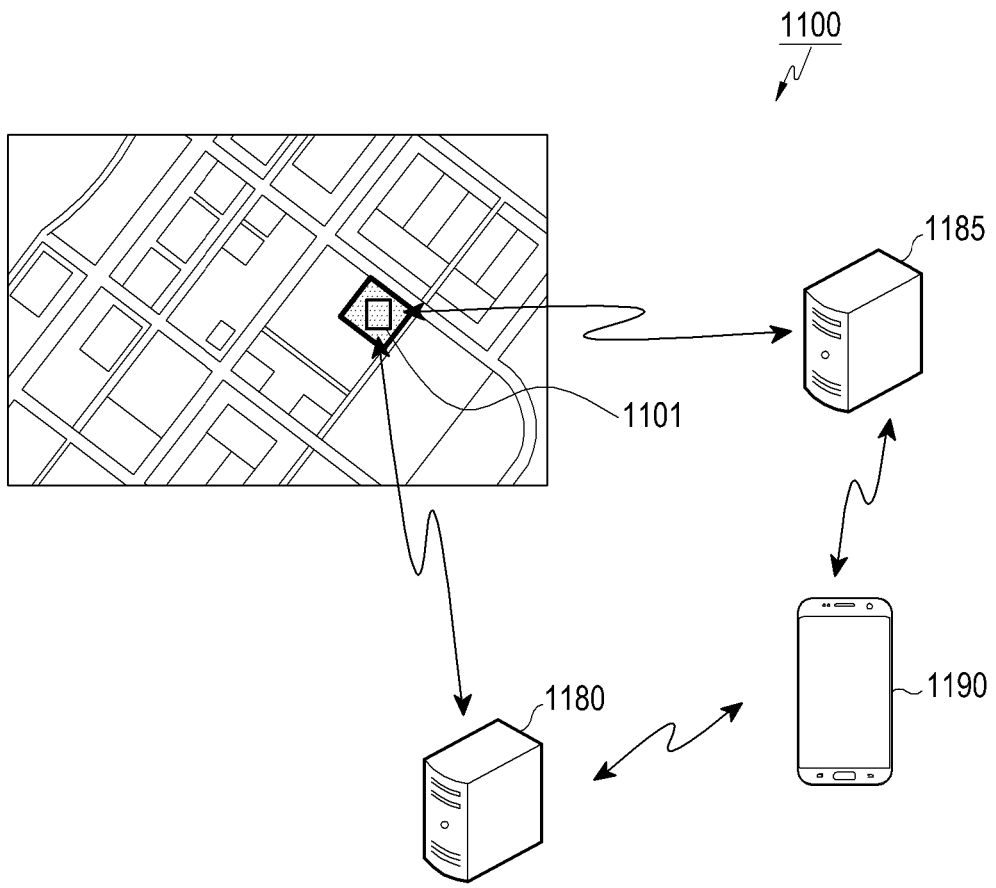
FIG. 11 is a schematic block diagram illustrating an electronic system according to various embodiments of the disclosure.

FIG. 11 is a schematic block diagram illustrating an electronic device according to various embodiments of the disclosure.

Referring to FIG. 11, an electronic system 1100 may include a first electronic device 1101, a first server 1180, a second server 1185, and a second electronic device 1190. The first electronic device 1101 or the second electronic device 1190 may be wholly or partially the same as the electronic device 200 illustrated in FIG. 2.

According to various embodiments, the electronic system 1100 may include a first electronic device 1101 configured to transmit positional information indicating the position of the first electronic device 1101 to a second server 1185, a first server configured to store information on the first electronic device 1101 (e.g., firmware data, data for positioning of an indoor position, data for positioning of an outdoor position, and/or software data, etc.), a second server 1185 configured to transmit the positional information to the second electronic device 1190, and a second electronic device 1190 configured to confirm the position of the first electronic device 1101 via the second server 1185.

The first electronic device 1101 may download data from the first server 1180. Alternatively, the first electronic device 1101 may upload data to the first server 1180. For example, the first electronic device 1101 may be implemented substantially the same as or similar to the electronic device 101 of FIG. 1.

According to various embodiments, the first electronic device 1101 may download data stored in the first server 1180 (e.g., firmware data, software data, data for positioning of an indoor position, and/or data for positioning of an outdoor position). Alternatively, the first electronic device 1101 may upload data for indoor location positioning, which is not stored in the first server 1180, and/or data for outdoor location positioning, to the first server 1180.

According to various embodiments, the first electronic device 1101 may obtain positional information indicative of the position of the first electronic device 1101 and may transmit the obtained positional information to the second server 1185.

According to various embodiments, the first electronic device 1101 may be implemented as a tracker that measures a position. For example, the first electronic device 1101 may use a low power wide area (LPWA). Alternatively, the first electronic device 1101 may be implemented as an NBIOT device.

In accordance with various embodiments, the first electronic device 1101 may transmit positional information indicative of the current position of the first electronic device 1101, in response to a request from the second server 1185. Alternatively, the first electronic device 1101 may transmit positional information indicative of the current position of the first electronic device 1101 at a designated cycle.

Although the first electronic device 1101 is described as a component of transmitting the positional information to the second server 1185 for convenience of explanation, the technical idea of the disclosure is not limited thereto. For example, the first electronic device 1101 may transmit information measured by the first electronic device 1101 to the second server 1185. For example, the first electronic device 1101 may transmit the measured information, environmental information (e.g., humidity, temperature, dust, etc.) and/or internal information (e.g., battery identifier information) of the first electronic device 1101 to the second server 1185.

According to various embodiment, the first electronic device 1101 may transmit and receive data with the first server 1180 via a plurality of communication channels. The first electronic device 1101 may transmit and receive data packets corresponding to each of the plurality of communication channels to and from the first server 1180. For example, the first electronic device 1101 may transmit and receive data to and from the first server 1180 using LPWA communication and general wireless communication (e.g., WI-FI or long term evolution (LTE)) and may transmit and receive data packets corresponding to each of LPWA communication and general communication to and from the first server 1180.

According to various embodiment, the first electronic device 1101 may transmit and receive data to and from the second server 1185 using LPWA communication. For example, the first electronic device 1101 may be requested for information on the current position of the first electronic device 1101 from the second server 1185 using LPWA communication. Alternatively, the first electronic device 1101 may transmit positional information on the current position to the second server 1185 using LPWA communication.

The first server 1180 may store data for the first electronic 1101 (e.g., firmware data, software data, data for positioning of an indoor position, and/or data for positioning of an outdoor position).

The first server 1180 may transmit the data to the first electronic device 1101 according to a request from the first electronic device 1101 or the second electronic device 1190. Alternatively, the first server 1180 may receive, from the first electronic device 1101, data for positioning of an indoor position that is not stored in the first server 1180 and/or data for positioning of an outdoor position. For example, the first server 1180 may be implemented to be substantially the same as or similar to the server 108 of FIG. 1.

The second server 1185 may manage information on the position of the first electronic device 1101.

The second server 1185 may receive positional information from the first electronic device 1101. The second server 1185 may transmit the positional information of the first electronic device 1101 to the second electronic device 1190 according to the request from the second electronic device 1190. Alternatively, the second server 1185 may store the positional information received from the first electronic device 1101. The second server 1185 may be implemented to be substantially the same as or similar to the server 108 of FIG. 1.

The first server 1180 and the second server 1185 may convert a format of data received through LPWA communication into a format of data corresponding to general wireless communication using a converter (not illustrated) included in each of the first server 1180 and the second server 1185. For example, the first server 1180 and the second server 1185 may convert an internet protocol (IP) address of data received through LPWA communication into an IP address corresponding to general wireless communication. For example, each of the first server 1180 and the second server 1185 may convert data for constrained application protocol (COAP) received from the first electronic device 1101 into data for hyper text transfer protocol (HTTP) using a converter (not illustrated).

FIG. 11 illustrates the first server 1180 and the second server 1185 as separate servers. However, the technical idea of the disclosure is not limited to this, and the first server 1180 and the second server 1185 may be implemented as a single server.

The second electronic device 1190 may receive positional information indicative of the position of the first electronic device 1101 via the second server 1185. The second electronic device 1190 may be implemented to be substantially the same as or similar to the electronic device 101 of FIG. 1. For example, the second electronic device 1190 may be implemented as a terminal capable of confirming the position of the first electronic device 1101.

When the second electronic device 1190 sends a request for the position of the first electronic device 1101 to the second server 1185, the second electronic device 1190 is capable of receiving the positional information from the second server 1185 and of confirming the position of the first electronic device 1101 based on the received positional information.

Hereinafter, for the convenience of explanation, the first electronic device 1101 will be described as an electronic device 1101 and the first server 1180 as a server 1180.

Figure 12:
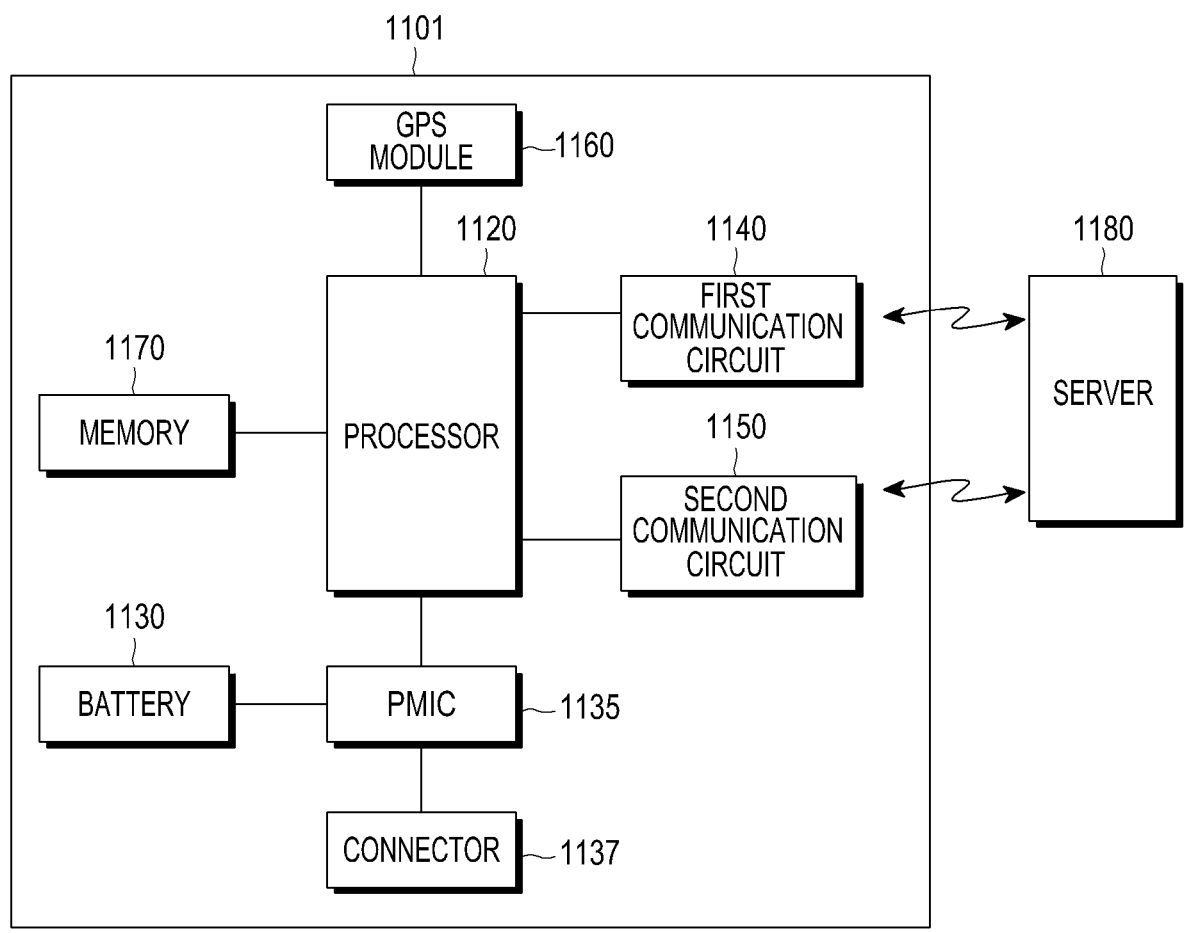
FIG. 12 is a block diagram of an electronic device according to various embodiments of the disclosure.

FIG. 12 is a block diagram of an electronic device according to various embodiments of the disclosure.

Referring to FIG. 12, the electronic device 1101 may include a processor 1120, a battery 1130, a PMIC 1135, a connector 1137, a first communication circuit 1140), a second communication circuit 1150, a global positioning system (GPS) module 1160, and a memory 1170.

The electronic device 1101 may be implemented to be substantially the same as or similar to the electronic devices 101 and 1101 illustrated in FIGS. 1 and 11.

The electronic device 1101 may include a plurality of communication circuits capable of transmitting and receiving data through a plurality of communication channels. The electronic device 1101 may include a housing. For example, the housing may form a portion or the entirety of the outer face of the electronic device 1101.

According to various embodiments, the electronic device 1101 may include a first communication circuit 1140 and a second communication circuit 1150. For example, the first communication circuit 1140 may provide first wireless communication using an LPWAN. The second communication circuit 1150 may provide second wireless communication using Wi-Fi (WI-FI) or LTE.

FIG. 12 illustrates the electronic device 1101 as including two communication circuits 1140 and 1150 in FIG. 12 for convenience of explanation. However, the number and/or type of communication circuits included in the electronic device 1101 is not limited thereto.

The processor 1120 may control the overall operation of the electronic device 1101. In accordance with various embodiments, the processor 1120 may control the first communication circuit 1140 and/or the second communication circuit 1150 to perform data transmission and reception with the first server 1180 and/or the second server 1185 through the first wireless communication and/or the second wireless communication.

According to various embodiments, the processor 1120 may transmit positional information of the electronic device 1101 to the second server 1185 via the first communication circuit 1140. For example, the positional information may mean information indicative of a position of the electronic device 1101 (e.g., GPS information and/or AP information). The processor 1120 may receive request information requesting the position of the electronic device from the second server 1185 via the first communication circuit 1140. The processor 1120 may send positional information indicative of the position of the electronic device 1101 to the second server 1185 via the first communication circuit 1140 in response to the request information received from the second server 1185.

According to various embodiments, the processor 1120 may receive an update request of the electronic device 1101 from the server 1180 via the first communication circuit 1140.

According to various embodiments, the processor 1120 may measure the position of the electronic device 1101 using the second communication circuit 1150. Processor 1120 may perform positioning of a Wi-Fi-based position using the second communication circuit 1150. For example, the processor 1120 may measure the position the electronic device 1101 based on a signal (or signal intensity) received from at least one AP (or coordinate values corresponding to the AP) around the electronic device 1101. Meanwhile, when the second communication circuit 1150 is capable of performing LTE communication, the processor 1120 is capable of measuring the position of the electronic device 1101 based on a signal (or signal intensity) received from at least one base station (or coordinate values corresponding to the base station) around the electronic device 1101.

The processor 1120 is capable of basically (by default) activating first communication circuit 1140.

The processor 1120 is capable of activating the first communication circuit 1140 only when performing positioning of a position or performing communication with the server 1180 for downloading or uploading data. For example, the processor 1120 is capable of basically deactivating the second communication circuit 1150. For example, when the second communication circuit 1150 is deactivated, the processor 1120 is capable of supplying a first amount of power to the second communication circuit 1150. When the second communication circuit 1150 is activated, the processor 1120 is capable of supplying a second amount of power to the second communication circuit 1150 in order to maintain this. At this time, the first amount of power may be smaller than the second amount of power.

Hereinafter, for convenience of explanation, it is assumed that the second communication circuit 1150 is a communication circuit that performs Wi-Fi communication. However, the technical idea of the disclosure is not limited thereto.

The processor 1120 may receive a GPS signal from the GPS module 1160. The processor 1120 may measure the position of the electronic device 1101 based on the GPS signal.

According to various embodiments, the processor 1120 may measure the position of the electronic device 1101 based on an early received one of the GPS signal and the Wi-Fi signal. For example, the processor 1120 may measure the position of the electronic device 1101 based on the GPS signal outdoors, and may measure the position of the electronic device 1101 based on the Wi-Fi signal indoors.

The processor 1120 may store information on at least one AP (e.g., coordinate values of the AP) around the electronic device 1101 in the memory 1170. Alternatively, the processor 1120 may update information on at least one AP around the electronic device 1101.

The processor 1120 may perform the update of the electronic device 1101. For example, the processor 1120 may download the first data for updating from the server 1180 and may perform the update. For example, the update of the electronic device 1101 may include security update for a portion or entirety of the electronic device, firmware update, update of data for outdoor positioning (e.g., GPS satellite information) and/or data for indoor positioning (e.g., WI-FI AP list (WI-FI tile)), and the like. The first data may mean data required for updating the electronic device 1101.

According to various embodiments, the processor 1120 may perform an update at a specified cycle. For example, data for outdoor positioning (e.g., GPS satellite information) may be updated every 7 days. Data for indoor positioning (e.g., a WI-FI AP list) may be updated every month.

According to various embodiments, the processor 1120 may perform an update of a request of the user or a request or the server 1180. For example, the processor 1120 may receive an update request of the electronic device 1101 via the first communication circuit 1140.

According to various embodiments, when the update of the electronic device 1101 is requested, the processor 1120 may determine whether to perform the update based on the attribute of the first data for an update and the power of the battery 1130. For example, the update of the electronic device 1101 may be requested every designated period. Alternatively, the update of the electronic device 1101 may be requested by the server 1180.

When the update of the electronic device 1101 is requested, the processor 1120 may determine the attribute of the first data for an update. For example, the attribute of the first data may be included in the update request. For example, the attribute of the first data may include a name, a size, a kind, and/or an importance level.

According to various embodiments, the processor 1120 may upload the second data stored in the electronic device 1101 to the server 1180.

According to various embodiments, the processor 1120 may perform an upload at a designated cycle. Alternatively, the processor 1120 may perform an upload according to a request of the user or a request or the server 1180. For example, the processor 1120 may receive an update request of the electronic device 1101 via the first communication circuit 1140.

For example, when the upload of the second data stored in the electronic device 1101 is requested, the processor 1120 may determine whether to perform the upload based on the attribute of the second data for an upload and the power of the battery 1130. For example, the second data may mean data for an upload. For example, the second data may mean data for a WI-FI AP list for indoor positioning, a WI-FI AP list not registered in the server 1180 of a database, or the data base. For example, the second data may include a WI-FI AP mac address for a WI-FI AP that is not registered in a server, a received signal strength indication (RSSI) value of a signal received from the WI-FI AP, and a GPS position value for which positioning has been performed based on the WI-FI AP.

When the upload of the electronic device 1101 is requested, the processor 1120 may determine the attribute of the second data for an upload. For example, the attribute of the second data may be included in the upload request. For example, the attribute of the second data may include a name, a size, a kind, and/or an importance level.

The processor 1120 may determine the power of the battery 1130 via the power management circuit 1135. For example, the processor 1120 may determine whether sufficient power is stored in the battery 1130 to perform an update or an upload depending on the attribute of the first data. Alternatively, the processor 1120 may also determine whether sufficient power to perform an update or an upload depending on the attribute of the first data or the second data is supplied from the outside (or an external charger) to the battery 1130.

According to various embodiments, when the power of the battery 1130 is sufficient to perform the update, the processor 1120 may download the first data from the server 1180 and may perform the update. On the contrary, when the power of the battery 1130 is not sufficient to perform the update, the processor 1120 may not perform the update.

According to various embodiments, when the power of the battery 1130 is sufficient to perform the upload, the processor 1120 may upload the second data to the server 1180. On the contrary, when the power of the battery 1130 is not sufficient to perform the upload, the processor 1120 may not perform the upload.

According to various embodiments, the processor 1120 may determine (or select) a communication circuit to download the first data among the first communication circuit 1140 and the second communication circuit 1150. For example, the processor 1120 may determine a communication circuit to download the first data among the first communication circuit 1140 and the second communication circuit 1150, depending on the attribute of the first data.

According to various embodiments, the processor 1120 may determine (or select) a communication circuit to upload the second data among the first communication circuit 1140 and the second communication circuit 1150, depending on the attribute of the second data to be uploaded.

Battery 1130 may store power. For example, the battery 1130 may store power supplied from an external charging device (or an external power source).

The connector 1137 may be connected to an external charging device (or external power source). For example, the connector 1137 may be connected to an external charging device (or an external power source) in a wired or wireless manner.

The power management circuit 1135 is capable of managing the power of the electronic device 1101. For example, the power management circuit 1135 may check the amount of power of the battery, the charged state of the battery, and/or the amount of power to be charged. For example, the power management circuit 1135 may manage the power stored in the battery 1130. Alternatively, the power management circuit 1135 is capable of managing the power supplied from an external charging device.

FIG. 12 illustrates the power management circuit 1135 and the processor 1120 as separate components. However, the power management circuit 1135 may be included in the processor 1120. That is, the processor 1120 may perform the functions of the power management circuit 1135.

The GPS module 1160 may receive a GPS signal. For example, the GPS signal may include information on the position of the electronic device 1101. Meanwhile, the GPS module 1160 may be included in the first communication circuit 1140.

Meanwhile, the GPS module 1160 is not limited to the GPS module, but may be implemented with a GNSS communication module (or an example of the GNSS communication module) described with reference to FIG. 1.

The memory 1170 may store data about the operation of the electronic device 1101. For example, the memory 1170 may store data for outdoor positioning of the electronic device 1101 (e.g., GPS satellite information) and data for indoor positioning (e.g., a WI-FI AP list (or WI-FI tile)).

The memory 1170 may store first data (e.g., update data) downloaded from the server 1180. The memory 1170 may store second data to be uploaded to the server (e.g., information on a WI-FI AP not stored in the WI-FI AP list).

FIG. 12 illustrates the processor 1120 and the memory 1170 as separate components. However, the processor 1120 and the memory may be implemented as an electrically connected single control circuit.

Figure 13:
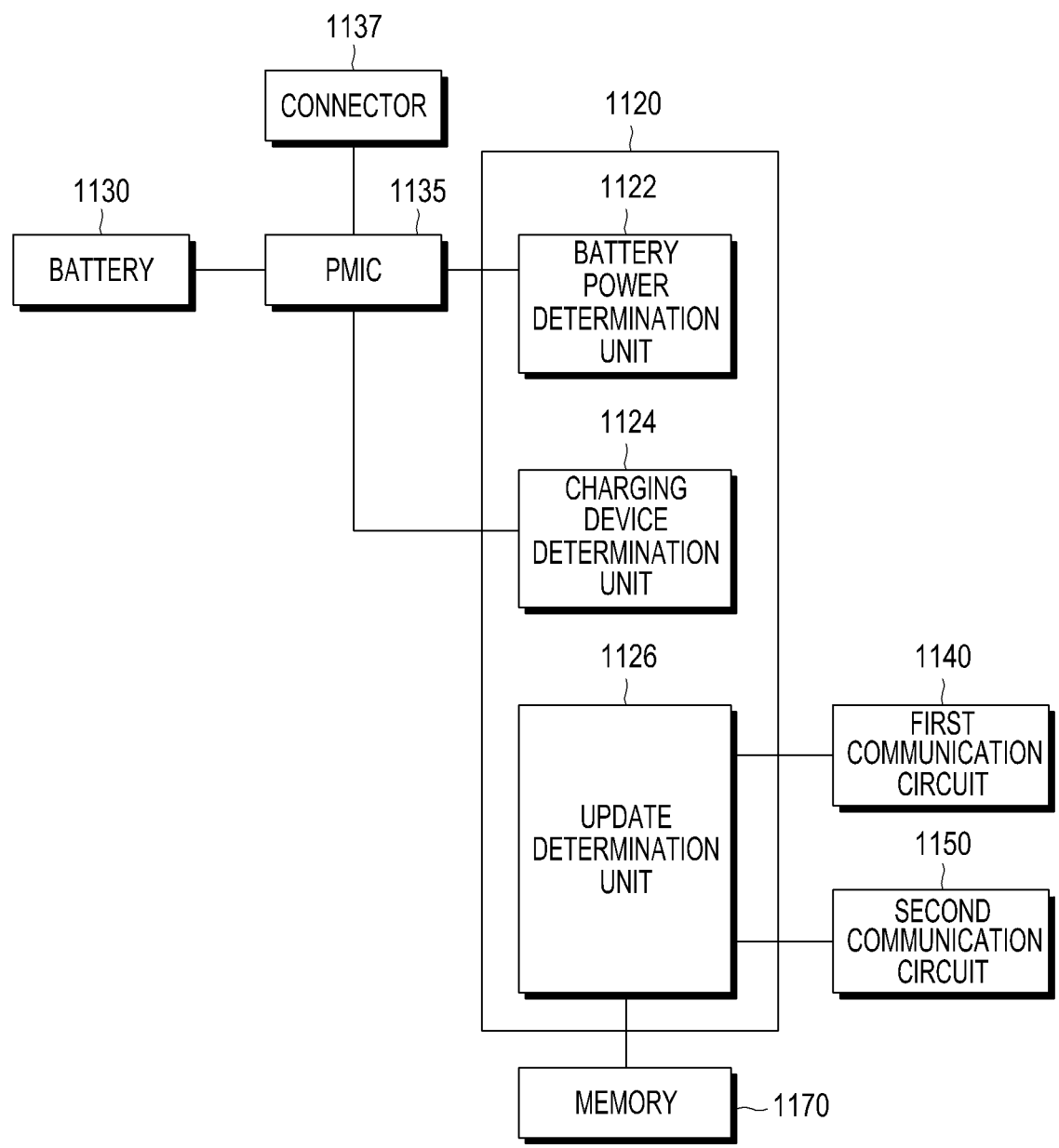
FIG. 13 is a block diagram for explaining an operation of a processor according to various embodiments of the disclosure.

FIG. 13 is a block diagram for explaining an operation of a processor according to various embodiments of the disclosure.

Referring to FIG. 13, the processor 1120 may include a battery power determination unit 1122, a charging device determination unit 1124, and an update determination unit 1126. For example, the battery power determination unit 1122, the charging device determination unit 1124, and the update determination unit 1126 may be configured to be temporarily loaded with instructions or may mean operations of the processor 1120.

The battery power determination unit 1122 may determine the power of the battery 1130 via the power management circuit 1135. For example, the battery power determination unit 1122 may determine the amount of power stored in the battery 1130. Alternatively, the battery power determination unit 1122 may determine the power consumption of the battery 1130 due to the execution of an update or an upload.

The charging device determination unit 1124 may determine the charging capability of the charging device connected to the connector 1137. For example, the charging device determination unit 1124 may determine the charging capability of the charging device based on the magnitude of the voltage applied to the connector 1137. For example, when the voltage applied to the connector 1137 is 9V, the charging device determination unit 1124 may determine that the charging capability is high (e.g., fast charging), and when the voltage applied to the connector 1137 is 5V, the charging device determination unit 1124 may determine that the charging capability is not high (e.g., normal charging). Alternatively, the charging device determination unit 1124 may determine the charging time of the battery 1130 based on the charging capability of the charging device.

The update determination unit 1126 may determine whether to perform an update (or an upload). For example, the update determination unit 1126 may determine whether to perform an update (or an upload) based on the determination results of the battery power determination unit 1122 and the charging device determination unit 1124. For example, the update determination unit 1126 may determine to perform an update when the power state of the battery is sufficient to perform an update, in consideration of the power of the battery and the charging capability of the charging device. According to one embodiment, the update determination unit 1126 may determine to wait for an update when the power state of the battery is not sufficient to perform the update, in consideration of the power of the battery and the charging capability of the charging device.

The update determination unit 1126 may determine whether to perform an update based on the attribute of the first data for an update. For example, when the importance of the first data is very high, the update determination unit 1126 may determine to perform regardless of the power of the battery 1130.

For example, since a large amount of power is consumed for an update when the size of the first data is large, the update determination unit 1126 may set the amount of power required for an update high. Since a small amount of power is consumed for an update when the size of the first data is small, the update determination unit 1126 may set the amount of power required for an update high.

The update determination unit 1126 may determine a communication circuit to download the first data for an update among the first communication circuit 1140 and the second communication circuit 1150, based on the attribute of the first data. The update determination unit 1126 may determine a communication circuit to download the first data among the first communication circuit 1140 and the second communication circuit 1150, based on the size and/or importance of the first data.

According to various embodiments, the update determination unit 1126 may determine a communication circuit to upload the second data among the first communication circuit 1140 and the second communication circuit 1150, based on the attribute of the second data.

Figure 14A:
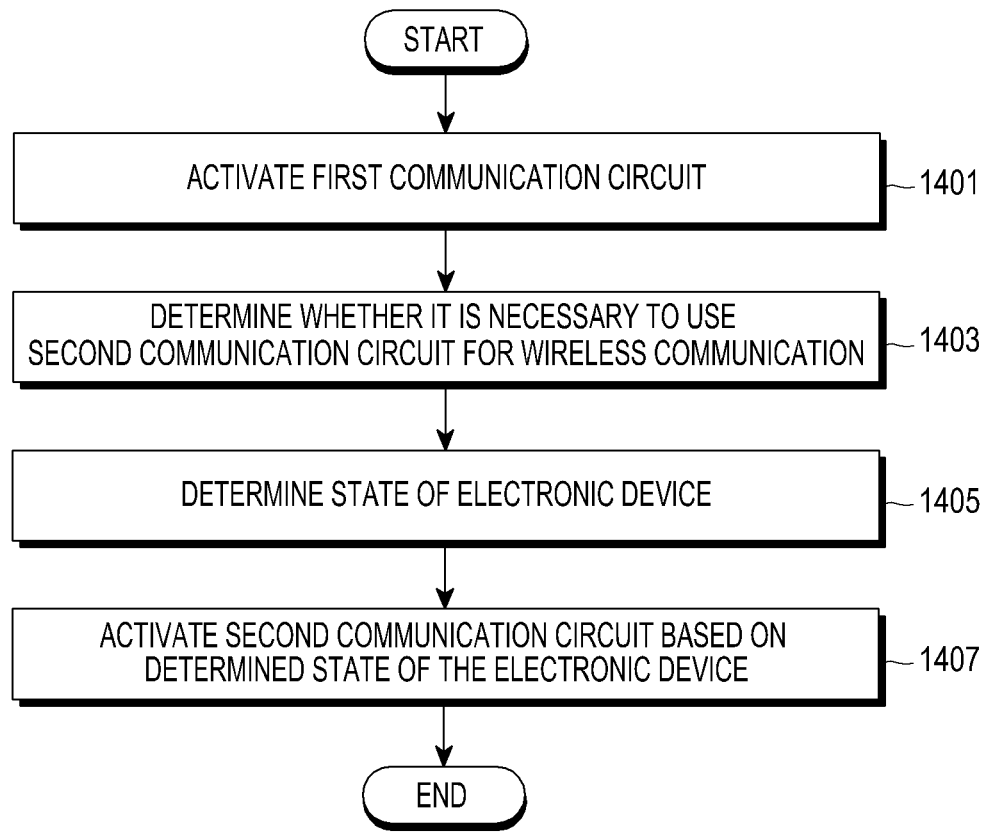
FIGS. 14A and 14B are flowcharts for explaining an operation of an electronic device according to various embodiments of the disclosure.

FIG. 14A is a flowchart for explaining an operation of an electronic device according to various embodiments of the disclosure.

Operations 1401 to 1407 may be executed through an electronic device (e.g., the electronic device 1101 in FIG. 11) or a processor (e.g., the processor 1120 in FIG. 12).

Referring to FIG. 14A, according to various embodiments, the processor 1120 may activate the first communication circuit 1140 to transmit and receive information on the position of the electronic device 1101 (operation 1401). For example, the information on the position of the electronic device 1101 may include information requesting the position of the electronic device 1101 and positional information indicative of the position of the electronic device 1101.

The processor 1120 may determine whether it is necessary to use the second communication circuit 1150 for wireless communication (operation 1403). For example, when it is necessary to update software of the electronic device 1101, to download or upload large-capacity data, and/or to download or upload high-importance data, the processor 1120 may determine that it is necessary to use the second communication circuit 1150.

The processor 1120 may determine the state of electronic device 1101 (e.g., the power state of battery 1130) (operation 1405). For example, the state of the electronic device 1101 may be determined based on the amount of power stored in the battery 1130 of the electronic device 1101, the presence or absence of external power supplied to the battery 1130, and/or an amount of external power supplied to the battery 1130.

The processor 1120 may activate the second communication circuit 1150 based on the determined state of the electronic device 1101 (operation 1407). For example, the processor 1120 may update the software of the electronic device 1101 via the activated second communication circuit 1150.

The processor 1120 may supply an amount of power to the second communication circuit 1150, which is increased compared to the amount of power when the second communication circuit 1150 is in the inactive state, in order to activate the second communication circuit 1150.

Figure 14B:
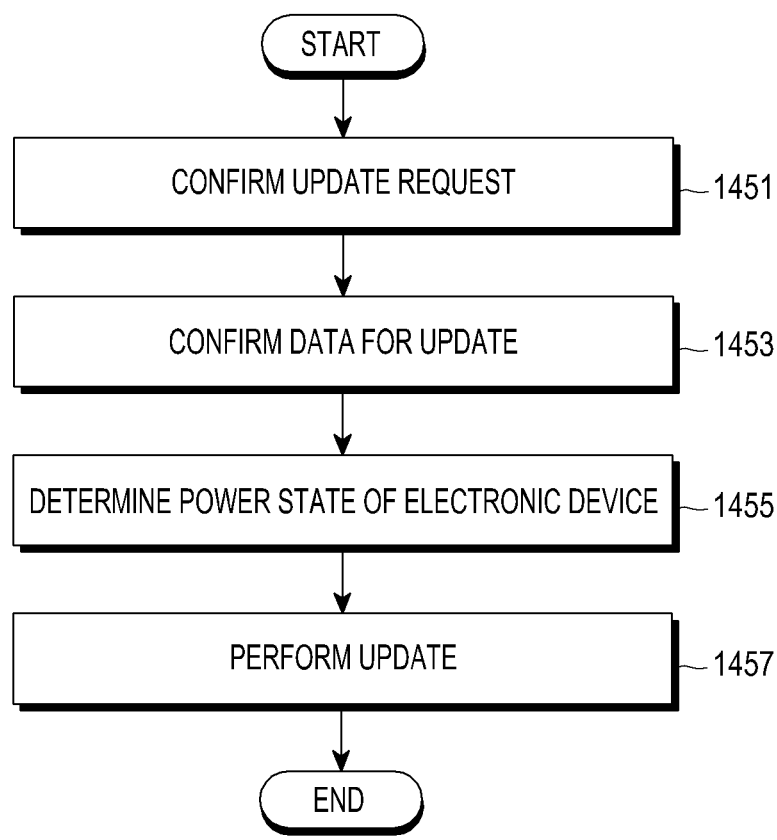

FIG. 14B is a flowchart for explaining an operation of an electronic device according to various embodiments of the disclosure.

Operations 1451 to 1457 may be performed through an electronic device (e.g., the electronic device 1101 in FIG. 11) or a processor (e.g., the processor 1120 in FIG. 12).

Referring to FIG. 14B, according to various embodiments, the processor 1120 may confirm an update request from the electronic device 1101 (operation 1451). For example, the processor 1120 may receive information on the update request from the server 1180 so as to confirm the update request. Alternatively, when the electronic device 1101 satisfies a designated condition, the processor 1120 may determine that there is an update request. For example, the specified condition may be satisfied when the electronic device 1101 has not performed update for a designated period, or when the electronic device 1101 is out of a designated region.

The processor 1120 may confirm the first data for updating the electronic device 1101 through the update request (operation 1453). For example, the processor 1120 may confirm the first data required for performing an update (or requiring download) through the update request, and may determine the attribute of the confirmed first data. For example, the update request may include information on the first data (e.g., an attribute for the first data).

Processor 1120 may determine the power state of the electronic device 1101 (operation 1455). For example, the processor 1120 may determine the amount of power stored in the battery 1130 and/or the power supply state of the battery 1130.

The processor 1120 may perform an update based on the determination result (operation 1457). For example, the processor 1120 may perform an update if the electronic device 1101 is in a state suitable for performing an update. The processor 1120 may not perform the update when the electronic device 1101 is in an unsuitable state for performing an update.

Figure 15:
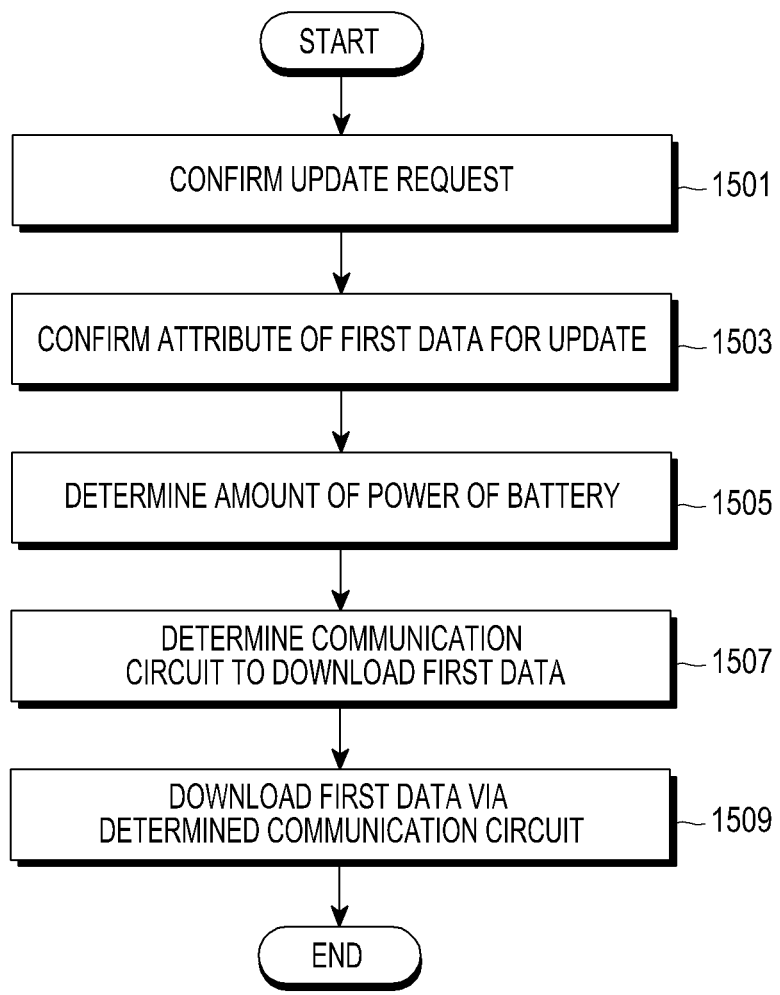
FIG. 15 is a flowchart for explaining an operation in an electronic device performs an update according to various embodiments of the disclosure.

FIG. 15 is a flowchart for explaining an operation in an electronic device performs an update according to various embodiments of the disclosure.

Operations 1501 to 1509 may be executed through an electronic device (e.g., the electronic device 1101 in FIG. 11) or a processor (e.g., the processor 1120 in FIG. 12).

Referring to FIG. 15, according to various embodiments, the processor 1120 may confirm an update request from the electronic device 1101 (operation 1501).

The processor 1120 may determine the attribute of the first data for an update through the update request (operation 1503). For example, the processor 1120 may determine the importance and/or size of the first data.

The processor 1120 may determine the amount of power of the battery 1130 (operation 1505). For example, the amount of power of the battery 1130 may be determined based on the amount of power stored in the battery 1130 and the amount of power supplied to the battery 1130. For example, the processor 1120 may determine the amount of power of the battery 1130 based on the amount of power currently stored in the battery (or the amount of remaining power), the presence or absence of power supplied from a charging device to the battery 1130, and/or the amount of power supplied to the battery 1130 from a charging device.

The processor 1120 may determine whether the amount of power of the battery 1130 is sufficient to perform an update. When the amount of power of the battery 1130 is sufficient to perform an update, the processor 1120 may download the first data for an update from the server 1180.

The processor 1120 may determine a communication circuit to download the first data among a plurality of communication circuits (e.g., the first communication circuit 1140 and the second communication circuit 1150) (operation 1507). For example, the processor 1120 may determine a communication circuit to download the first data in consideration of power consumption and/or transmission rate.

The processor 1120 may download the first data via the determined communication circuit (operation 1509). For example, the processor 1120 may download the first data through the first wireless communication, or may download the first data through the second wireless communication.

Figure 16:
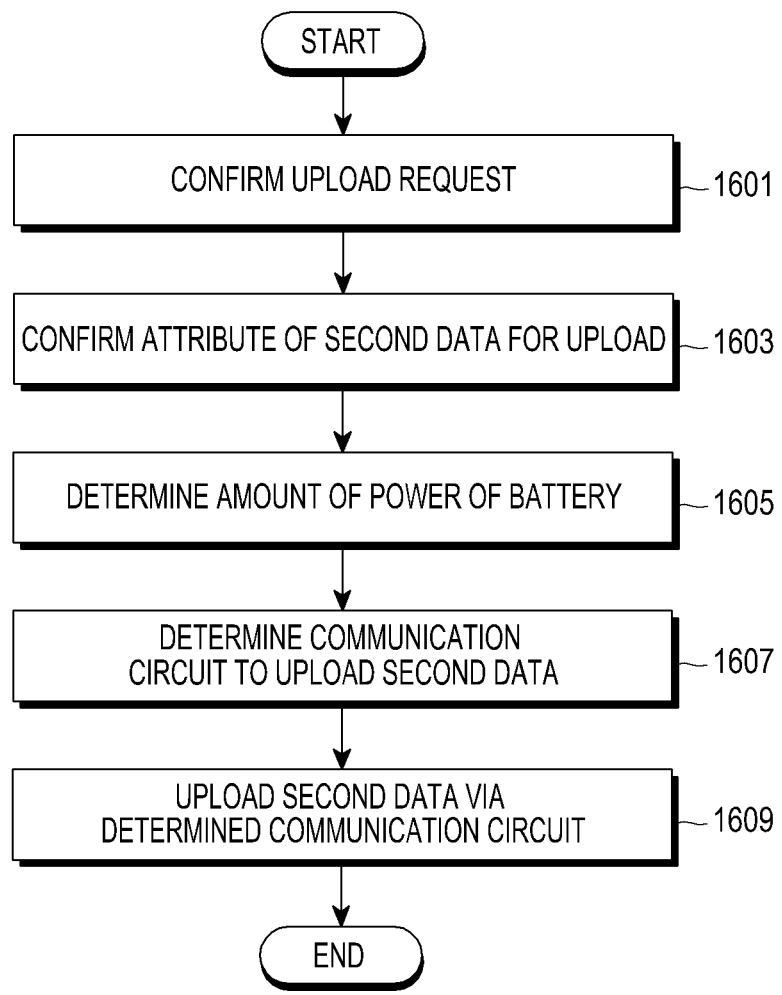
FIG. 16 is a flowchart for explaining an operation in which an electronic device performs an upload according to various embodiments of the disclosure.

FIG. 16 is a flowchart for explaining an operation in which an electronic device performs an upload according to various embodiments of the disclosure.

Operations 1601 to 1609 may be executed through an electronic device (e.g., the electronic device 1101 in FIG. 11) or a processor (e.g., the processor 1120 in FIG. 12).

Referring to FIG. 16, according to an embodiment, the processor 1120 may confirm an upload request from the electronic device 1101 (operation 1601). For example, the processor 1120 may determine that there is an upload request when upload is not performed in the electronic device 1101 for a designated period or when the second data stored in the memory 1170 (e.g., information on a WI-FI AP not included in the WI-FI AP list registered in the server 1180) is equal to or larger than a designated size.

The processor 1120 may determine the attribute of the second data for an update through the upload request (operation 1603). For example, the processor 1120 may determine the importance and/or size of the second data to be uploaded to the server 1180.

The processor 1120 may determine the amount of power of the battery 1130 (operation 1605). Alternatively, the processor 1120 may determine whether the amount of power of the battery 1130 is sufficient to perform an upload. When the amount of power of the battery 1130 is sufficient to perform an upload, the processor 1120 may upload the second data for an upload to the server 1180.

The processor 1120 may determine a communication circuit to upload the second data among a plurality of communication circuits (e.g., the first communication circuit 1140 and the second communication circuit 1150) (operation 1607). For example, the processor 1120 may determine a communication circuit to upload the second data in consideration of power consumption and/or transmission rate.

The processor 1120 may upload the second data via the determined communication circuit (operation 1609). For example, the processor 1120 may upload the second data through the first wireless communication, or may upload the second data through the second wireless communication.

Figure 17:
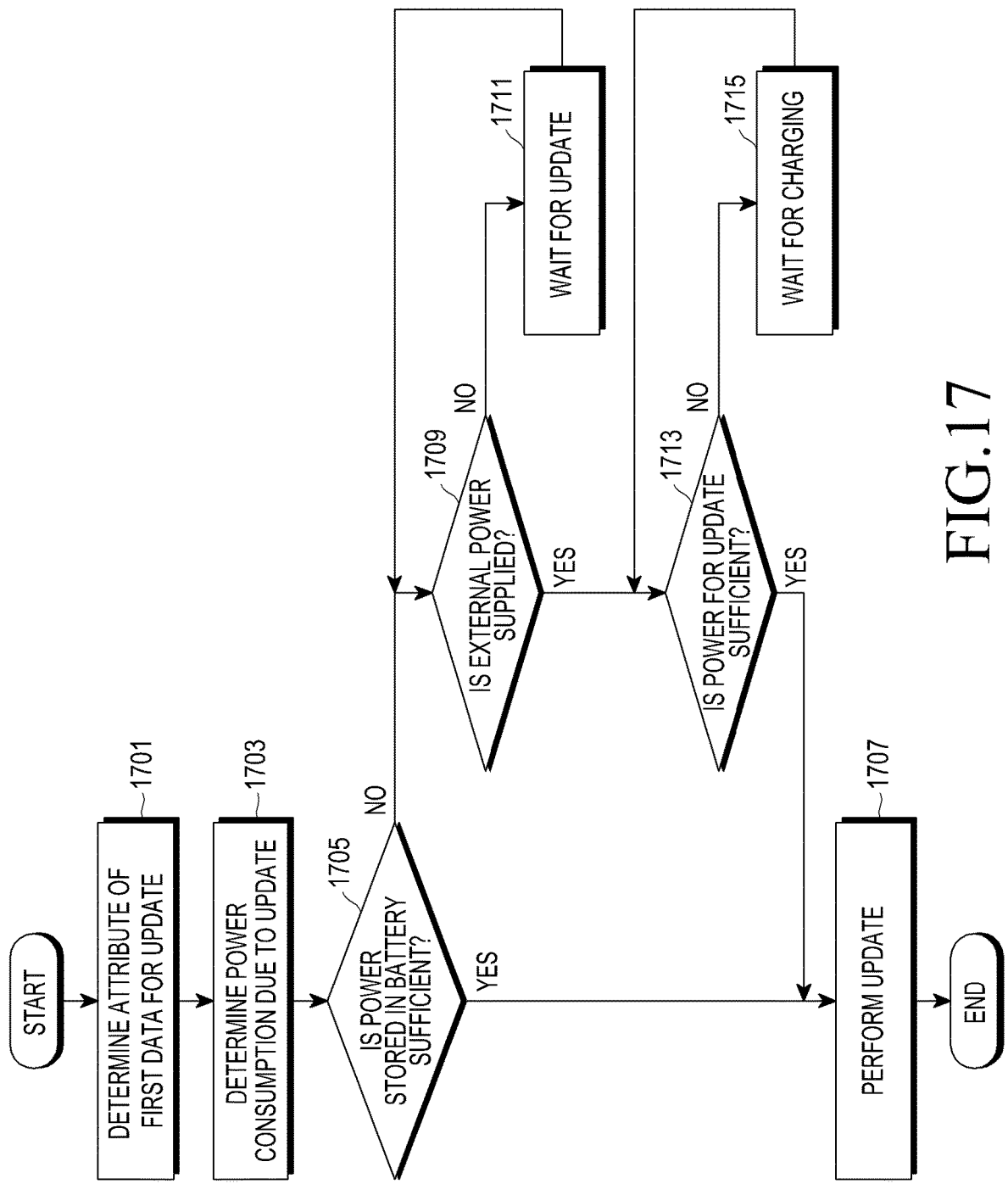
FIG. 17 is a flowchart for explaining an operation in which an electronic device performs an update according to various embodiments of the disclosure.

FIG. 17 is a flowchart for explaining an operation in which an electronic device performs an update according to various embodiments of the disclosure.

Operations 1701 to 1715 may be executed through an electronic device (e.g., the electronic device 1101 in FIG. 11) or a processor (e.g., the processor 1120 in FIG. 12).

Referring to FIG. 17, the processor 1120 may determine the attribute of the first data for an update (operation 1701). For example, the processor 1120 may determine the importance and/or size of the first data.

The processor 1120 may determine the power consumption due to the update (operation 1703). For example, the processor 1120 may determine the power consumption required to download the first data and install the downloaded first data in the electronic device 1101, based on the size of the first data. For example, the processor 1120 may determine a power consumption corresponding to the size of the first data using a mapping table and/or a specific algorithm.

The processor 1120 may determine whether the power stored in the battery 1130 is sufficient to perform an update (operation 1705).

When the power stored in battery 1130 is sufficient to perform an update (operation 1705), the processor 1120 may perform an update (operation 1707).

When the power stored in battery 1130 is not sufficient to perform an update (No in operation 1705), the processor 1120 may determine whether power is supplied to the battery 1130 from an external charging device (operation 1709).

When no power is supplied to the battery 1130 (No in operation 1709), the processor 1120 may wait for an update (operation 1711). For example, the processor 1120 may not perform an update in order to prevent failure of update due to power shortage of the battery 1130. The processor 1120 may wait for an update until power required to perform the update is supplied.

When power is supplied to the battery 1130 (operation 1709), the processor 1120 may determine whether the amount of power currently stored in the battery 1130 and the power supplied from the outside are sufficient to perform the update (operation 1713). For example, the processor 1120 may determine, based on the charging capability of the charging device that supplies power, whether power sufficient to perform the update is supplied.

When power sufficient to perform the update is not supplied (No in operation 1713), the processor 1120 may wait until the battery 1130 is charged with the power required to perform the update (operation 1715).

When power sufficient to perform the update is supplied (Yes in operation 1713), the processor 1120 may perform the update (operation 1707).

Figure 18:
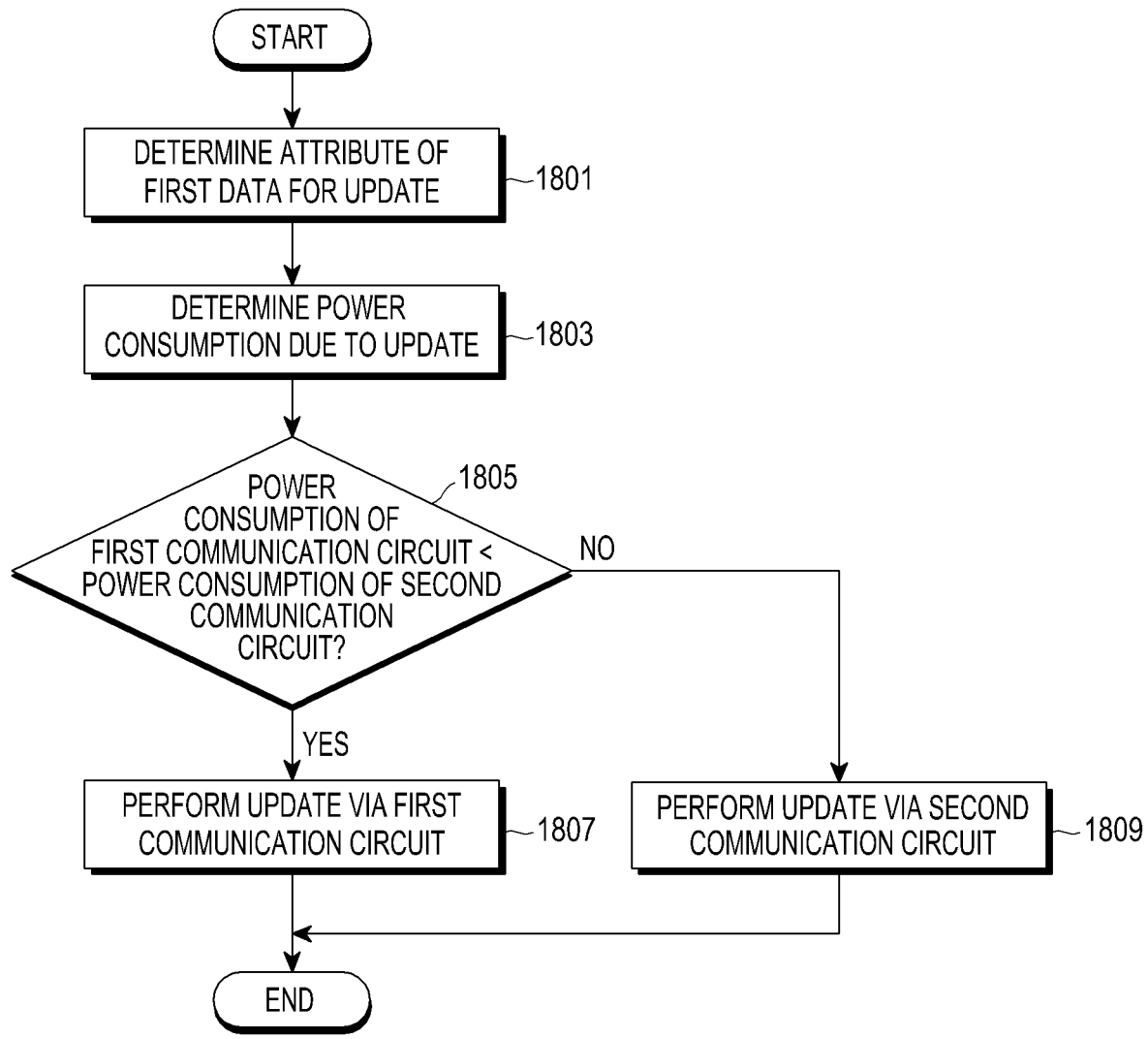
FIG. 18 is a flowchart for explaining an operation in which an electronic device performs an update according to various embodiments of the disclosure.

FIG. 18 is a flowchart for explaining an operation in which an electronic device performs an update according to various embodiments of the disclosure.

Operations 1801 to 1809 may be executed through an electronic device (e.g., the electronic device 1101 in FIG. 11) or a processor (e.g., the processor 1120 in FIG. 12).

Referring to FIG. 18, according to various embodiments, the processor 1120 may determine the attribute of the first data for an update (operation 1801). For example, the processor 1120 may determine the importance and/or size of the first data.

The processor 1120 may determine the power consumption due to the update (operation 1803). For example, the processor 1120 may determine the amount of power required to download the first data via the first communication circuit 1140 and the amount of power required to download the first data via the second communication circuit 1150. For example, the processor 1120 may determine power consumption based on a time required for downloading the first data via each of the first communication circuit 1140 and the second communication circuit 1150 and the driving power of each of the first communication circuit 1140 and the second communication circuit 1150.

The processor 1120 may compare the amount of power required to download the first data via the first communication circuit 1140 and the amount of power required to download the first data via the second communication circuit 1150 (operation 1805).

The processor 1120 may use a communication circuit that consumes less power among the first communication circuit 1140 and the second communication circuit 1150.

When the power consumption of the first communication circuit 1140 is less than the power consumption of the second communication circuit 1150 (Yes in operation 1805), the processor 1120 may download the first data via the first communication circuit 1140 and may perform an update (operation 1807).

When the power consumption of the first communication circuit 1140 is not less than the power consumption of the second communication circuit 1150 (No in operation 1805), the processor 1120 may download the first data via the second communication circuit 1150 and may perform an update (operation 1809).

Figure 19A:
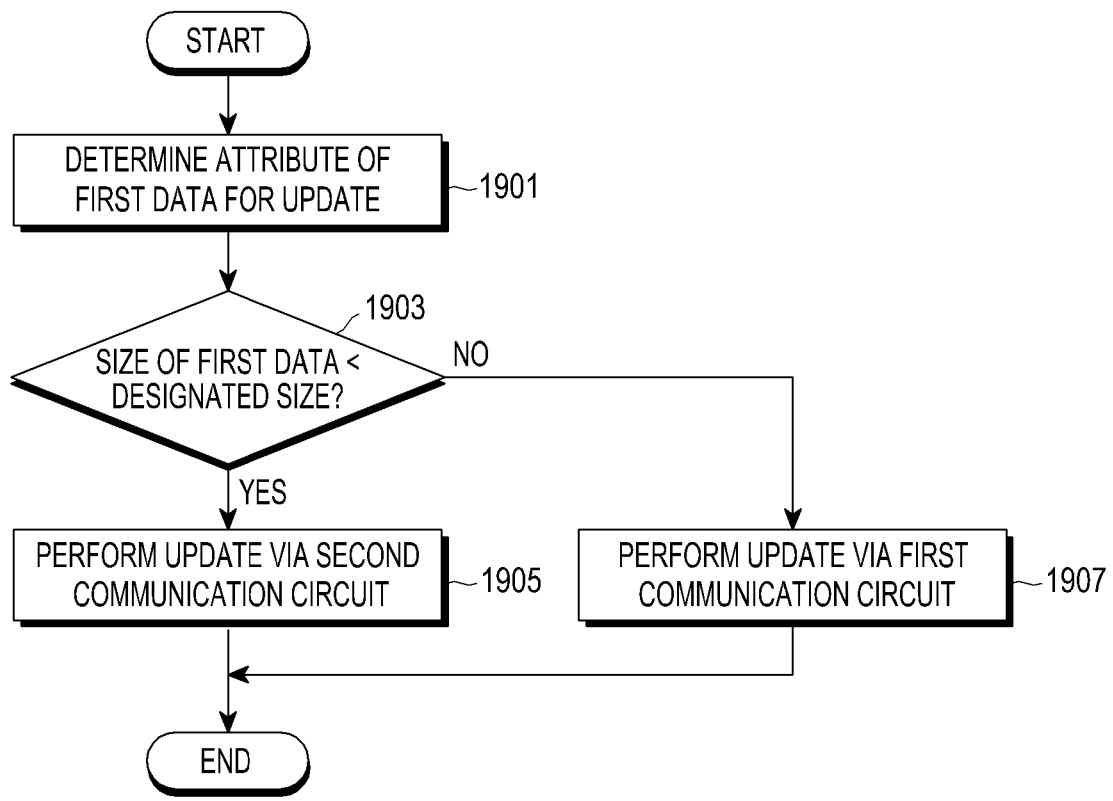
FIG. 19A is a flowchart for explaining an operation in which an electronic device performs an update according to various embodiments of the disclosure.

FIG. 19A is a flowchart for explaining an operation in which an electronic device performs an update according to various embodiments of the disclosure.

Operations 1901 to 1907 may be executed through an electronic device (e.g., the electronic device 1101 in FIG. 11) or a processor (e.g., the processor 1120 in FIG. 12).

Referring to FIG. 19A, according to various embodiments, the processor 1120 may determine the attribute of the first data for an update (operation 1901). For example, the processor 1120 may determine the importance and/or size of the first data.

According to various embodiments, the processor 1120 may determine whether the size of the first data is greater than a designated size of the first data (operation 1903). For example, the designated size may be set by the user or by the processor 1120.

When the size of the first data is greater than the designated size (Yes in operation 1903), the processor 1120 may download the first data via the second communication circuit 1150 and may perform the update (operation 1905).

When the size of the first data is not greater than the designated size (No in operation 1905), the processor 1120 may download the first data via the first communication circuit 1140 and may perform the update (operation 1907).

Figure 19B:
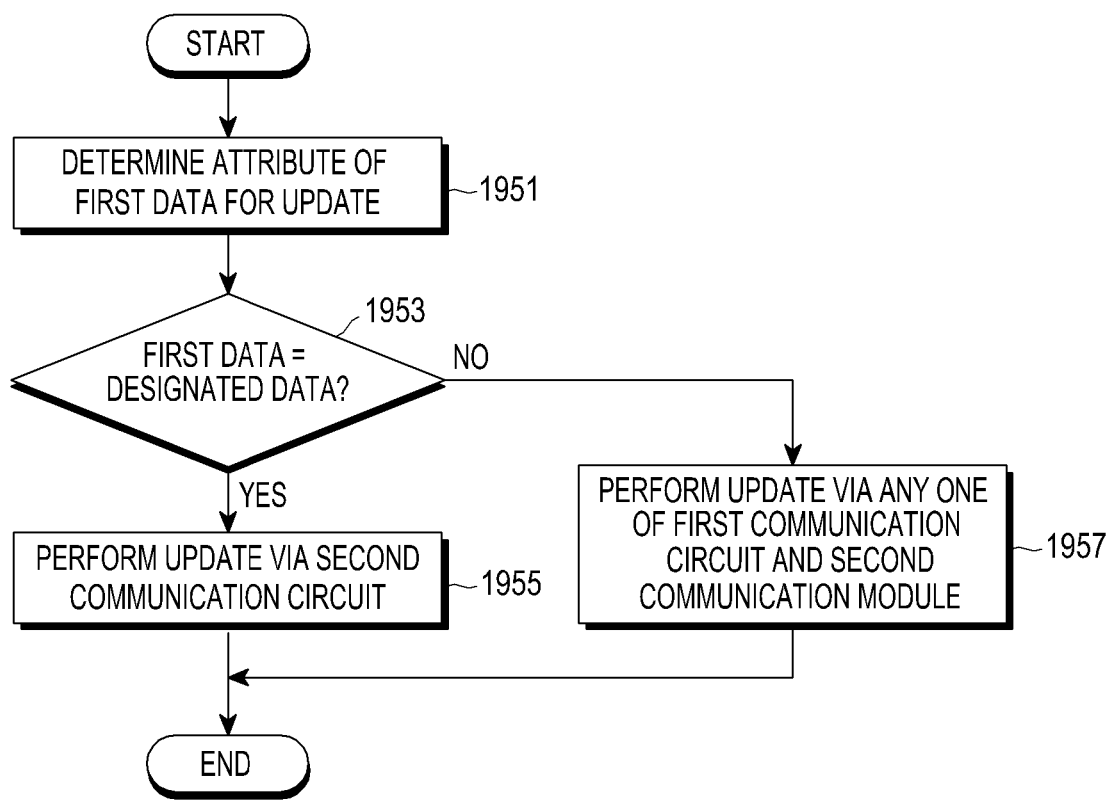
FIG. 19B is a flowchart for explaining an operation in which an electronic device performs an update according to various embodiments of the disclosure.

FIG. 19B is a flowchart for explaining an operation in which an electronic device performs an update according to various embodiments of the disclosure.

Operations 1951 to 1957 may be executed through an electronic device (e.g., the electronic device 1101 in FIG. 11) or a processor (e.g., the processor 1120 in FIG. 12).

Referring to FIG. 19B, according to various embodiments, the processor 1120 may determine the attribute of the first data for an update (operation 1951). For example, the processor 1120 may determine the name (or type), the importance, and/or size of the first data.

According to various embodiments, the processor 1120 may determine whether the first data is designated data (operation 1953). For example, the designated data may be information on a WI-FI AP list and/or information on a database managed by the server 1180 for providing a cloud service through the server 1180. For example, the designated data may be set by the user or by the processor 1120.

When the first data is the designated data (Yes in operation 1953), the processor 1120 may download the first data via the second communication circuit 1150 and may perform the update (operation 1955).

When the first data is not the designated data (No in operation 1953), the processor 1120 may download the first data through any one of the first communication circuit 1140 and the second communication circuit 1150, and may perform the update (operation 1957). For example, the processor 1120 may determine a communication module to download the first data based on the power state of the battery 1130 and/or the transmission rate of data.

Figure 20:
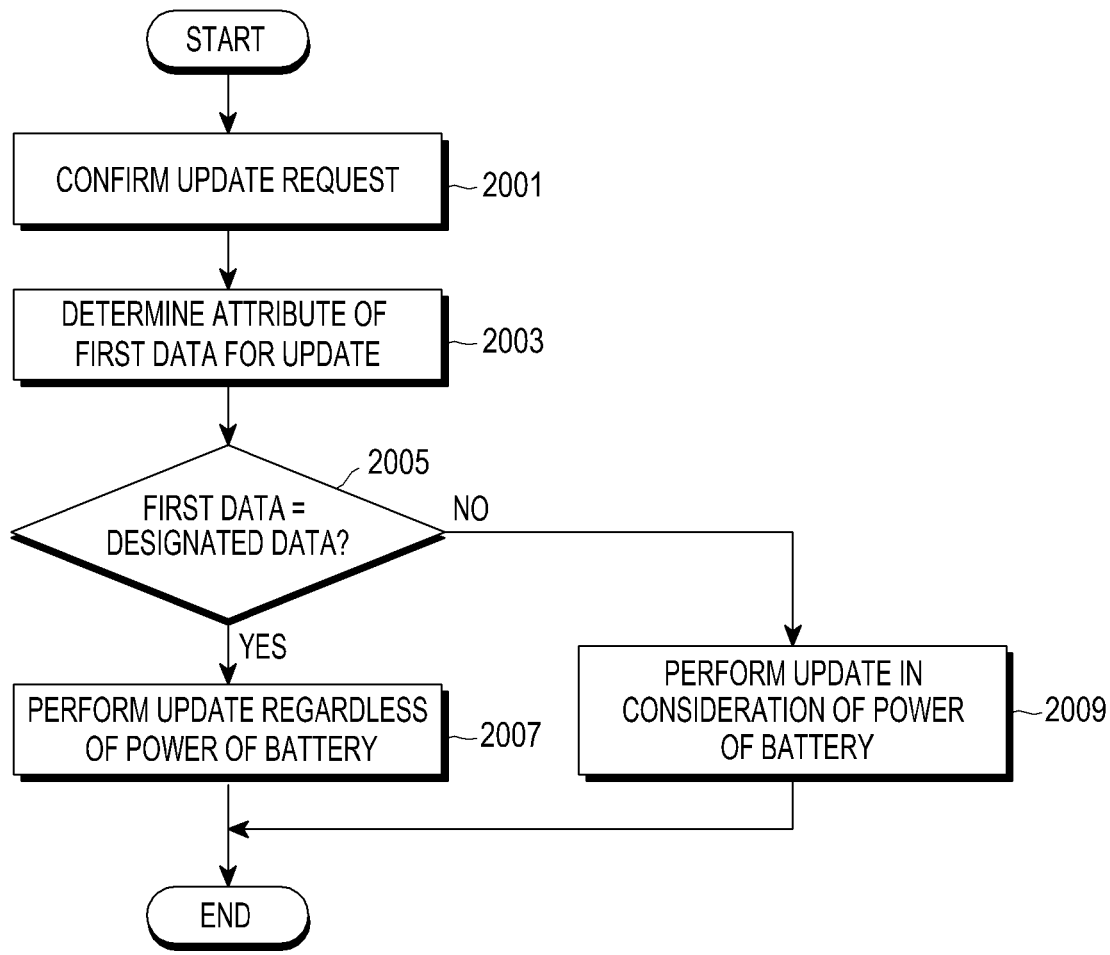
FIG. 20 is a flowchart for explaining an operation in which an electronic device performs an update according to various embodiments of the disclosure.

FIG. 20 is a flowchart for explaining an operation in which an electronic device performs an update according to various embodiments of the disclosure.

Operations 2001 to 2009 may be executed through an electronic device (e.g., the electronic device 1101 in FIG. 11) or a processor (e.g., the processor 1120 in FIG. 12).

Referring to FIG. 20, according to various embodiments, the processor 1120 may confirm an update request from the electronic device 1101 (operation 2001).

The processor 1120 may determine the attribute of the first data for an update through the update request (operation 2003). For example, the processor 1120 may determine the importance and/or size of the first data.

The processor 1120 may determine the importance of the first data (operation 2005). For example, when the first data is included in the designated data, the processor 1120 may determine the first data as important data. Alternatively, when the value indicative of the importance of the first data is a designated value or more, the processor 1120 may determine the first data as important data.

When the first data is critical data (Yes in operation 2005), the processor 1120 may perform an update regardless of the power of battery 1130 (operation 2007). Alternatively, when the importance of the first data is equal to or greater than a designated value, the processor 1120 may perform an update regardless of the power of battery 1130 (operation 2007). For example, the processor 1120 may determine a communication circuit to download the first data regardless of the amount of power of the battery 1130, and may download the first data via the determined communication circuit so as to perform an update. The processor 1120 may determine a communication circuit based on at least one of power consumption and download speed.

When the first data is not important data (No in operation 2005), the processor 1120 may perform an update based on the amount of power of the battery 1130 (operation 2009). Alternatively, when the importance of the first data is equal to or greater than a designated value, the processor 1120 may perform an update based on the amount of power of battery 1130 (operation 2009). For example, the processor 1120 may determine a communication circuit to download the first data based on the amount of power of the battery 1130, and may download the first data via the determined communication circuit so as to perform an update.

Meanwhile, an operation in which the electronic device 1101 described with reference to FIGS. 17, 18, 19A and 19B, and 20 performs an update may be equally applicable to an operation in which the electronic device 1101 performs an upload.

FIG. 21 is a table for determining a communication method according to an attribute of data according to various embodiments of the disclosure.

Referring to FIG. 21, when an update or an upload is requested, a processor (the processor 1120 of FIG. 11) may determine the attribute of data for an update or an upload.

Data for a "security update" may be data having high importance. The processor 1120 may perform a "security update" via any one communication circuit among the first communication circuit 1140 and the second communication circuit 1150 regardless of the power of the battery. For example, data having immediacy may mean data for which the update of the electronic device 1101 should be performed immediately or quickly. Since data for a "security update" has very high importance, the data may be data having "immediacy."

Data for a "small capacity update" may be data having a size that is not larger than a designated size. The processor 1120 may determine whether to perform the update based on the power (or power state) of the battery and the size of data. Alternatively, the processor 1120 may perform the "small capacity update" via any one communication circuit among the first communication circuit 1140 and the second communication circuit 1150, based on the power (or power state) of the battery and the size of data.

Data for a "larger capacity update" may be data having a size that is larger than a designated size. The processor 1120 may determine whether to perform an update based on the power (or power state) of the battery and the size of data.

Alternatively, the processor 1120 may perform the "large capacity update" via the second communication circuit 1150.

Data for "Wi-Fi AP list information" may be included in designated data. The processor 1120 may determine whether to perform an update based on the power (or power state) of the battery and the size of data. Alternatively, the processor 1120 may perform the update of the "Wi-Fi AP list information" via the second communication circuit 1150.

Figure 22A:
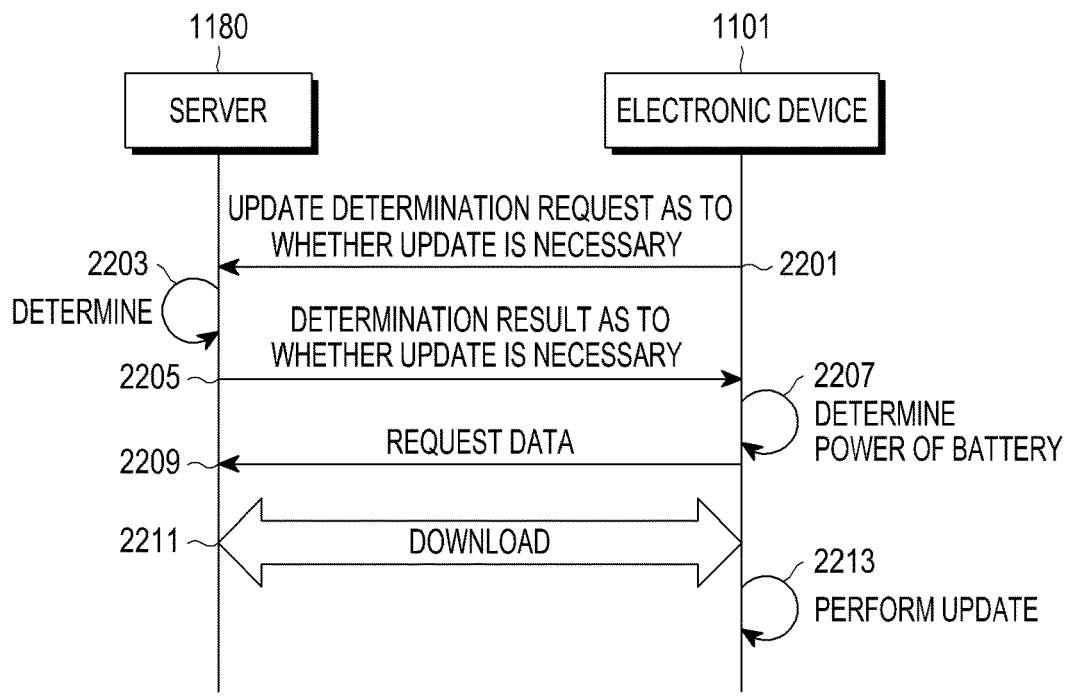
FIG. 22A is a data flow for explaining an operation in which an electronic device downloads data from a server according to various embodiments of the disclosure.

FIG. 22A is a data flow for explaining an operation in which an electronic device downloads data from a server according to various embodiments of the disclosure.

Operations 2201 to 2213 may be executed through an electronic device (e.g., the electronic device 1101 in FIG. 11) or a processor (e.g., the processor 1120 in FIG. 12).

Referring to FIG. 22A, the electronic device 1101 may request update determination as to whether update is necessary via the first communication circuit 1140 (operation 2201). For example, the electronic device 1101 may transmit information on the electronic device 1101 (e.g., software information on the electronic device 1101) to the server 1180, together with the determination request.

The server 1180 may determine whether the update of the electronic device 1101 is necessary (operation 2203). The server 1180 may determine whether the update of the electronic device 1101 is necessary based on the information on the electronic device 1101. For example, the server 1180 may determine whether at least one of "security update," "small capacity update," and "large capacity update" is necessary based on the information on the electronic device 1101.

The electronic device 1101 may receive the update determination result from the server 1180 via the first communication circuit 1140 (operation 2205). For example, the electronic device 1101 may determine whether there is an update request based on the determination result received from the server 1180.

The electronic device 1101 may determine the power state of the battery 1180 so as to determine whether to perform an update (operation 2207). For example, the electronic device 1101 may determine whether the power state of the battery 1180 is sufficient to perform an update.

When it is determined to perform an update, the electronic device 1101 may request the first data for an update from the server 1180 (operation 2209). For example, the electronic device 1101 may request the first data via the first communication circuit 1140 or the second communication circuit 1150. The electronic device 1101 may determine the communication circuit depending on the attribute of the first data. When the type of the first data is "large capacity data" or "information on WI-FI AP list" having a large capacity, the electronic device 1101 may request the first data via the second communication circuit 1150.

The electronic device 1101 may download the first data via the first communication circuit 1140 or the second communication circuit 1150 (operation 2211). The electronic device 1101 may determine the communication circuit depending on the attribute of the first data. When the type of the first data is "large capacity data" or "information on WI-FI AP list," which has a large size, the electronic device 1101 may download the first data via the second communication circuit 1150.

The electronic device 1101 may perform the update of the electronic device 1101 using the downloaded first data (operation 2213).

Figure 22B:
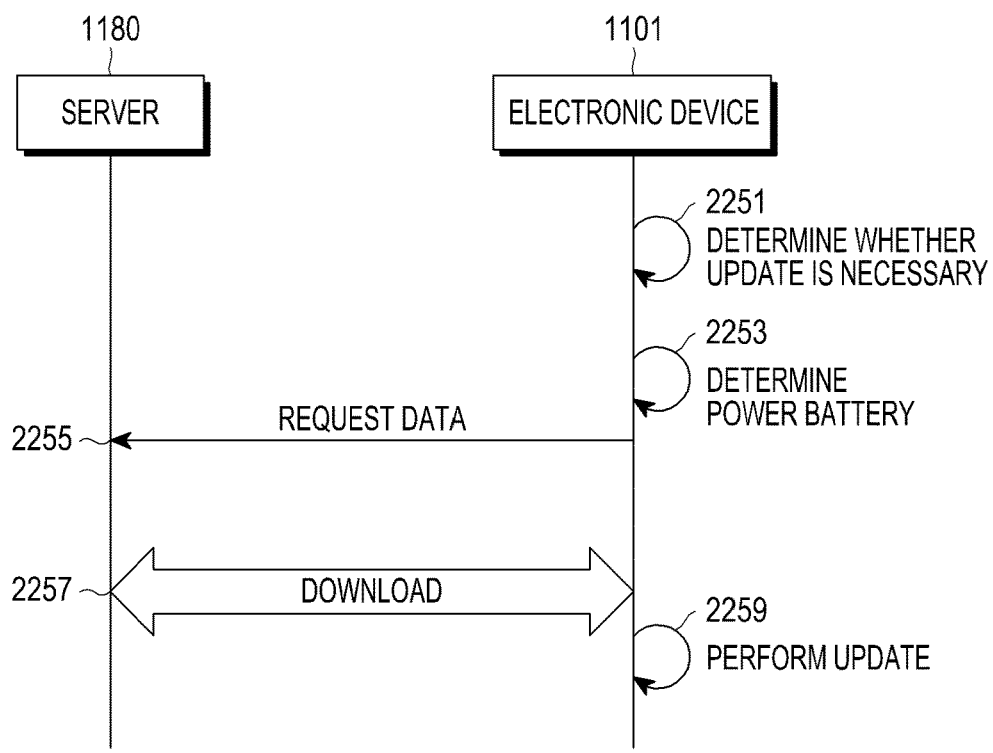
FIG. 22B is a data flow for explaining an operation in which an electronic device downloads data from a server according to various embodiments of the disclosure.

FIG. 22B is a data flow for explaining an operation in which an electronic device downloads data from a server according to various embodiments of the disclosure.

Operations 2251 to 2259 may be executed through an electronic device (e.g., the electronic device 1101 in FIG. 11) or a processor (e.g., the processor 1120 in FIG. 12). For example, the electronic device 1101 may perform a reboot operation for an update.

Referring to FIG. 22B, the electronic device 1101 may confirm an update request (operation 2251). For example, when the update has not been performed for a designated period, the electronic device 1101 may determine that an update is necessary. For example, when the information for the WI-FI AP list has not been updated for a designated period, the electronic device 1101 may determine that an update is necessary.

The electronic device 1101 may determine the power state of the battery 1130 so as to determine whether to perform an update (operation 2253). For example, the electronic device 1101 may determine whether the power state of the battery 1130 is sufficient to perform an update.

When it is determined to perform an update, the electronic device 1101 may request the first data for an update from the server 1180 (operation 2255). For example, the electronic device 1101 may request the first data via the first communication circuit 1140 or the second communication circuit 1150. When the first data is "large capacity data" or "information on WI-FI AP list," the electronic device 1101 may request the first data via the second communication circuit 1150.

The electronic device 1101 may download the first data from the server 1180 via the first communication circuit 1140 or the second communication circuit 1150 (operation 2257). The electronic device 1101 may determine the communication circuit depending on the attribute of the first data. When the type of the first data is "large capacity data" or "information on WI-FI AP list," which has a large size, the electronic device 1101 may download the first data via the second communication circuit 1150.

The electronic device 1101 may perform the update of the electronic device 1101 using the downloaded first data (operation 2259). For example, the electronic device 1101 may perform a reboot operation for an update.

Figure 22C:
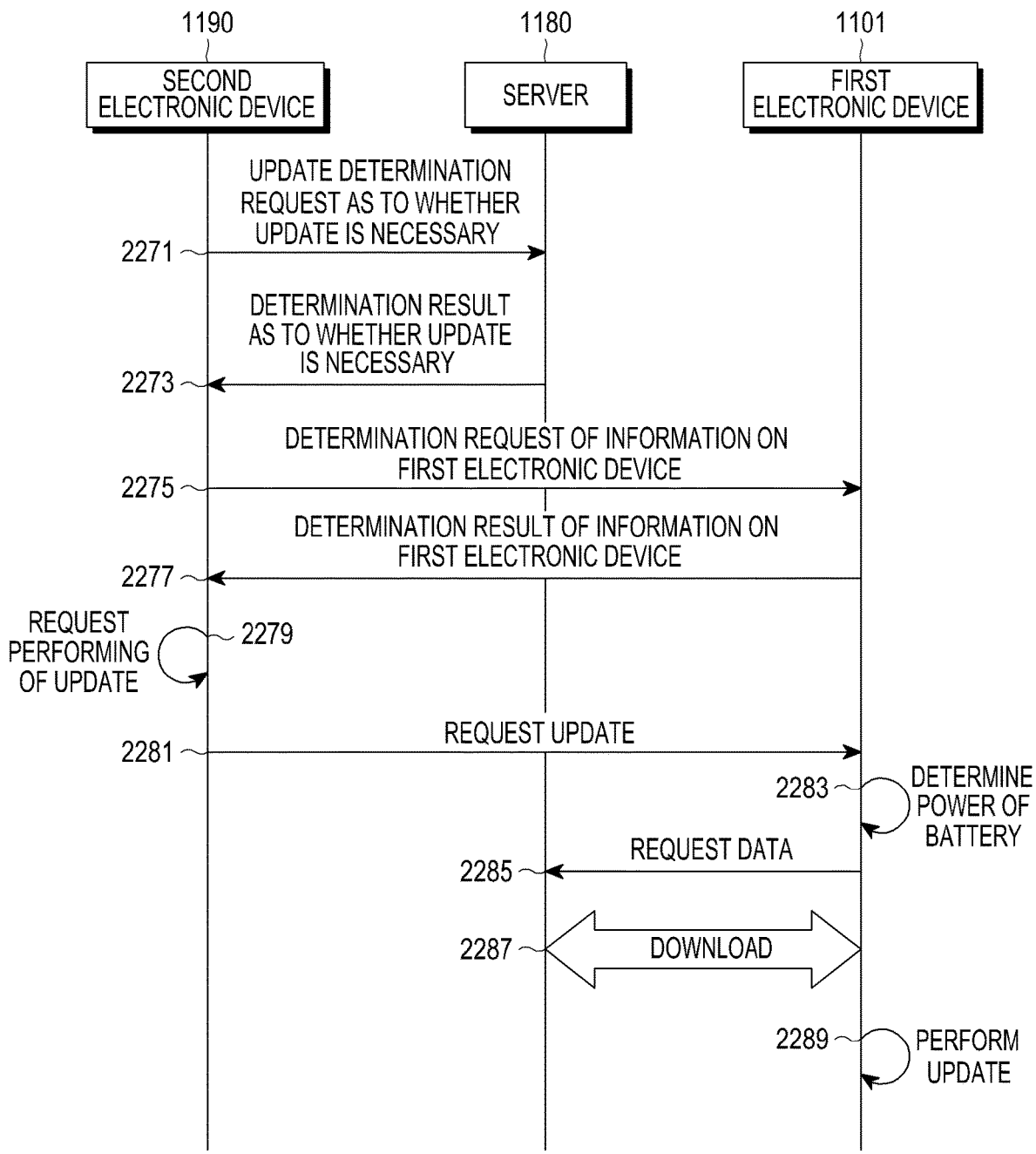
FIG. 22C is a data flow for explaining an operation in which an electronic device downloads data from a server according to various embodiments of the disclosure.

FIG. 22C is a data flow for explaining an operation in which an electronic device downloads data from a server according to various embodiments of the disclosure.

Operations 2271 to 2289 may be executed through a first electronic device (e.g., the electronic device 1101 in FIG. 11) (or a processor (e.g., the processor 1120 in FIG. 12)) and a second electronic device (e.g., the electronic device 1190 of FIG. 11).

Referring to FIG. 22C, the second electronic device 1190 may request update determination as to whether update of the first electronic device 1101 is necessary from the server 1180 (operation 2271). For example, the second electronic device 1190 may transmit information on the first electronic device 1101 (e.g., the type or model of the first electronic device 1101) to the server 1180, together with the determination request.

The server 1180 may determine whether the update of the first electronic device 1101 is necessary. The server 1180 may determine whether the update of the first electronic device 1101 is necessary based on the information on the first electronic device 1101 (e.g., the type or model of the first electronic device 1101). For example, the server 1180 may determine whether it is necessary to add new firmware data for the first electronic device 1101 or new data for positioning of an indoor position (or positioning of an outdoor position) based on information on the first electronic device 1101.

The second electronic device 1190 may receive a determination result as to whether update of the first electronic device 1101 is necessary from the server 1180 (operation 2273). For example, the second electronic device 1190 may determine whether there is an update request based on the determination result received from the server 1180.

When the update of the first electronic device 1101 is required, the second electronic device 1190 may request confirmation on information on the first electronic device 1101 from the first electronic device 1101 (operation 2275). For example, the second electronic device 1190 may request confirmation of a software version included in the first electronic device 1101 from the first electronic device 1101.

The second electronic device 1190 may receive the confirmation result of the information on the first electronic device 1101 (operation 2277). The second electronic device 1190 may determine whether the update of the first electronic device 1101 is necessary based on the received confirmation result. For example, the second electronic device 1190 may compare the software version of the first electronic device 1101 with the version of the firmware data stored in the server 1180 and may determine whether the update of the first electronic device 1101 is necessary.

When the update of the first electronic device 1101 is necessary, the second electronic device 1190 may inform the user that the update of the first electronic device 1101 is necessary. For example, the second electronic device 1190 may display, via a display (not illustrated) of the second electronic device 1190, a message requesting to perform the update of the first electronic device 1101.

The second electronic device 1190 may be requested by the user to perform an update (operation 2279). For example, the second electronic device 1190 may be requested to perform an update in response to an input by a user.

The second electronic device 1190 may request the first electronic device 1101 to update the first electronic device 1101 (operation 2281).

The first electronic device 1101 may determine the power state of the battery 1130 so as to determine whether to perform an update in response to the update request received from the second electronic device 1190 (operation 2283). For example, the first electronic device 1101 may determine whether the power state of the battery 1130 is sufficient to perform an update.

When it is determined to perform an update, the first electronic device 1101 may request the first data for an update from the server 1180 (operation 2285). For example, the first electronic device 1101 may request the first data via the first communication circuit 1140 or the second communication circuit 1150. The first electronic device 1101 may determine the communication circuit depending on the attribute of the first data. When the type of the first data is "large capacity data" or "information on WI-FI AP list" having a large capacity, the first electronic device 1101 may request the first data via the second communication circuit 1150.

The first electronic device 1101 may download the first data via the first communication circuit 1140 or the second communication circuit 1150 (operation 2287). The first electronic device 1101 may determine the communication circuit depending on the attribute of the first data. When the type of the first data is "large capacity data" or "information on WI-FI AP list," which has a large size, the first electronic device 1101 may download the first data via the second communication circuit 1150.

The first electronic device 1101 may perform the update of the electronic device 1101 using the downloaded first data (operation 2289). For example, the first electronic device 1101 may perform a reboot operation for an update.

Although FIG. 22C illustrates that the second electronic device 1190 directly transmits and receives data to and from the first electronic device 1101, the disclosure is not limited thereto. For example, the second electronic device 1190 may transmit and receive data to and from the first electronic device 1101 via a server (e.g., the second server 1185 of FIG. 11).

Figure 23:
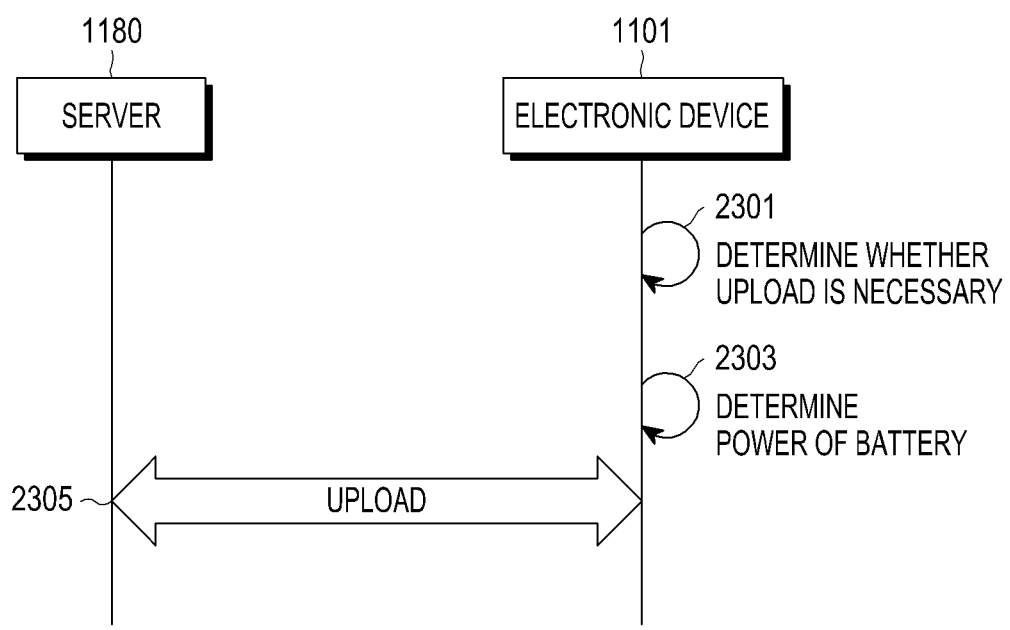
FIG. 23 is a data flow for explaining an operation in which an electronic device upload data to a server according to various embodiments of the disclosure.

FIG. 23 is a data flow for explaining an operation in which an electronic device upload data to a server according to various embodiments of the disclosure.

Operations 2301 to 2305 may be executed through an electronic device (e.g., the electronic device 1101 in FIG. 11) or a processor (e.g., the processor 1120 in FIG. 12).

Referring to FIG. 23, an electronic device (the electronic device 1101 of FIG. 11) may confirm an upload request (operation 2301). For example, when upload has not been performed for a designated period, the electronic device 1101 may determine that an upload is necessary. Alternatively, when the size of data stored in the memory 1170 is equal to or larger than the designated size, the electronic device 1101 may determine that an upload is necessary.

The electronic device 1101 can determine the attribute of the second data that needs to be uploaded.

The electronic device 1101 may determine the power state of the battery 1130 based on the attribute of the second data and may determine whether to perform an upload (operation 2303). For example, the electronic device 1101 may determine whether the power state of the battery 1130 is sufficient to perform an upload.

Once it is determined to perform an upload, the electronic device 1101 may upload the second data to the server 1180 via the first communication circuit 1140 or the second communication circuit 1150 (operation 2305).

An electronic device according to various embodiments may include a housing (e.g., the housing 210 in FIG. 4) including a first plate (e.g., the first plate 211 in FIG. 4) that faces a first direction, a second plate (e.g., the second plate 213 in FIG. 4) that faces a second direction opposite to the first direction, and a side member (e.g., the side member 212 in FIG. 4) that surrounds a space between the first and second plates; a PCB (e.g., the PCB 220 in FIG. 4) disposed in the space of the housing; a battery (e.g., the battery 230 in FIG. 4) that at least partially faces the PCB; a bracket (e.g., the bracket 250 in FIG. 4) that surrounds at least one face of the battery; and an elastic structure (e.g., the elastic structure 240 in FIG. 4) disposed between the battery and the bracket and located on an edge region of the battery.

The elastic structure includes an elastic member (e.g., elastic member 241 in FIG. 4), a first adhesive member (e.g., the first adhesive member 243 in FIG. 4) disposed on a first face (e.g., the first face 241a in FIG. 4) of the elastic member that faces the first direction, and a second adhesive member (e.g., the second adhesive member 245 in FIG. 4) disposed on a second face (e.g., the second face 241b in FIG. 4) that faces the second direction of the elastic member, and the first adhesive member and the second adhesive member may be located such that the first adhesive member and the second adhesive member do not overlap, at least in part, in a plane extending through the first adhesive member, the elastic member, and the second adhesive member.

According to various embodiments, the elastic structure may include an opening (e.g., the opening 247 in FIG. 4) in a central region thereof, and one region of the battery exposed through the opening may be spaced apart from the bracket.

According to various embodiments, the bracket may include an accommodation space (e.g., the accommodation space 251 in FIG. 4) configured to accommodate the battery and the elastic structure, and the elastic member may be disposed to correspond to the accommodation space such that the elastic member is in contact with at least a portion of the inner face of the accommodation space.

According to various embodiments, the elastic member includes an opening in a central region thereof and includes a first region formed to surround a periphery of the opening and a second region formed to surround a periphery of the first region, and the first adhesive member may be bonded to the first region and the second adhesive member may be bonded to the second region.

According to various embodiments, the elastic member may include an opening in a central region thereof and may include a first region formed to surround a periphery of the opening and a second region formed to surround a periphery of the first region, the second adhesive member may be bonded to the first region, and the first adhesive member may be bonded to the second region.

According to various embodiments, the PCB may be disposed to be spaced apart from the central region of the battery.

According to various embodiments, a circumference of the battery may be smaller than an outer circumference of the elastic member.

According to various embodiments, the first adhesive member and the second adhesive member may include an opening in a central region thereof, and the opening of the first adhesive member and the opening of the second adhesive member may have different sizes.

An electronic device according to various embodiments may include: a housing including a first plate, a second plate that faces the first plate, and a side member that surrounds a space between the first and second plates; a PCB disposed adjacent to the first plate in the space of the housing; a battery that at least partially faces the PCB; and a bracket that surrounds at least one face of the battery. The PCB or the first plate may be mounted on at least a region of the bracket, so that the PCB and the battery may be at least partially spaced apart from each other.

According to various embodiments, the PCB is disposed between the second plate and the battery, and the gap between the PCB and the one face of the battery may be maintained substantially constant by a support member disposed between the PCB and the battery.

According to various embodiments, the support member may be disposed in an edge region of the battery.

According to various embodiments, the electronic device may further include a radiation structure disposed between the first plate and the second plate, and configured to transmit/receive wireless waves or to generate an electromagnetic field.

According to various embodiments, the electronic device may further an elastic structure disposed between the battery and the bracket and located on an edge region of the battery, and the elastic structure may include an elastic member the inside of which is opened, a first adhesive member disposed on a first face of the elastic member that faces the first direction, and a second adhesive member disposed on a second face that faces the second direction of the elastic member, and the first adhesive member and the second adhesive member may be disposed such that the first adhesive member and the second adhesive member do not overlap, at least in part, in a plane extending through the first adhesive member, the elastic member, and the second adhesive member.

According to various embodiments, the bracket includes an accommodation space configured to accommodate the battery and the elastic structure, and the elastic member may be disposed to correspond to the accommodation space such that the elastic member may be in contact with at least a portion of the inner face of the accommodation space.

According to various embodiments, the bracket includes an accommodation space configured to accommodate the battery and the elastic structure, and the elastic member may be disposed to correspond to the accommodation space such that the elastic member may be in contact with at least a portion of the inner face of the accommodation space.

According to various embodiments, the elastic member may include an opening in a central region thereof and may include a first region formed to surround a periphery of the opening and a second region formed to surround a periphery of the first region, the first adhesive member may be bonded to the first region and the second adhesive member may be bonded to the second region.

According to various embodiments, the first adhesive member may be attached to the edge region of the battery, the second adhesive member may be attached to the bracket accommodation space, and when an external impact is applied, the elastic member may alleviate the impact of the battery through relative up-down movement and attenuation movement of the first region with respect to the second region.

According to various embodiments, the first adhesive member and the second adhesive member may at least partially overlap each other when the first face or the second face of the elastic member is viewed.

An electronic device according to various embodiments may include: a housing including an upper structure and a lower structure which are coupled to each other so as to form an inner space; a PCB located within the space and connected to the upper structure; a bracket located within the space between the PCB and the underlying structure; a wireless communication circuit configured to provide wireless communication using a LPWAN and provided on the PCB; a battery electrically connected to the PCB, located in the space between the PCB and the bracket, and mounted on the bracket; an elastic member located between the battery and the bracket; at least one first adhesive member disposed between the battery and the elastic member to be in contact with the battery and the elastic member; and at least one second adhesive member disposed between the bracket and the elastic member to be in contact with the bracket and the elastic member.

According to various embodiments, the LPWAN includes a NBIOT network.

According to various embodiments, the elastic member may include at least one of foam and rubber.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
a housing including a first plate that faces a first direction, a second plate that faces a second direction opposite to the first direction, and a side member that surrounds a space between the first and second plates;
a printed circuit board (PCB) disposed in the space of the housing;
a battery that at least partially faces the PCB;
a bracket that surrounds at least one face of the battery; and
an elastic structure disposed between the battery and the bracket and located on an edge region of the battery,
wherein the elastic structure includes an elastic member, a first adhesive member disposed on a first face of the elastic member that faces the first direction, and a second adhesive member disposed on a second face of the elastic member that faces the second direction,
wherein the first adhesive member and the second adhesive member are located such that the first adhesive member and the second adhesive member do not overlap, at least in part, in a plane extending through the first adhesive member, the elastic member, and the second adhesive member,
wherein the elastic member includes an opening in a central region thereof and includes a first region formed to surround a periphery of the opening and a second region formed to surround a periphery of the first region, and
wherein one of the first adhesive member and the second adhesive member is bonded to the first region, and the other of the first and second adhesive members is bonded to the second region.

2. The electronic device of claim 1, wherein the elastic structure includes an opening in a central region thereof, and one region of the battery exposed through the opening is spaced apart from the bracket.

3. The electronic device of claim 2,
wherein the bracket includes an accommodation space configured to accommodate the battery and the elastic structure, and
wherein the elastic member is disposed to correspond to the accommodation space such that the elastic member is in contact with at least a portion of an inner face of the accommodation space.

4. The electronic device of claim 3, wherein the PCB is spaced apart from a central region of the battery.

5. The electronic device of claim 3, wherein a circumference of the battery is smaller than an outer circumference of the elastic member.

6. The electronic device of claim 2, wherein the first adhesive member and the second adhesive member include an opening in a central region thereof, and the opening of the first adhesive member and the opening of the second adhesive member have different sizes.

* * * * *